(12) United States Patent
Nakagawa

(10) Patent No.: US 7,709,291 B2
(45) Date of Patent: May 4, 2010

(54) METHOD OF DISPOSING SELECTIVELY TWO TYPES OF SUBSTANCES ON SURFACE OF SUBSTRATE

(75) Inventor: Tohru Nakagawa, Shiga (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/627,801

(22) Filed: Nov. 30, 2009

(65) Prior Publication Data

US 2010/0073452 A1 Mar. 25, 2010

Related U.S. Application Data

(63) Continuation of application No. PCT/JP2009/001179, filed on Mar. 17, 2009.

(30) Foreign Application Priority Data

Mar. 31, 2008 (JP) .............................. 2008-091076

(51) Int. Cl.
*H01L 21/84* (2006.01)

(52) U.S. Cl. ..................... 438/99; 427/97.3; 427/98.4; 438/758; 438/780

(58) Field of Classification Search ................... 438/99, 438/758, 780; 427/97.3, 98.4
See application file for complete search history.

(56) References Cited

U.S. PATENT DOCUMENTS 5,716,704 A * 2/1998 Ogawa et al. ................ 428/391
6,194,837 B1 2/2001 Ozawa (Continued)

FOREIGN PATENT DOCUMENTS

JP 63-147105 6/1988

(Continued)

OTHER PUBLICATIONS

Li, S.P., et al., "Polymer transistors fabricated by painting of metallic nanoparticles", Applied Physics Letters, 2006, pp. 122105-1-122105-3, vol. 89, American Institute of Physics.

(Continued)

*Primary Examiner*—Richard A. Booth
(74) *Attorney, Agent, or Firm*—McDermott Will & Emery LLP

(57) ABSTRACT

The present invention is a method of disposing selectively on a surface of a substrate a first substance having a hydrophilic surface and a second substance having a surface coated with a hydrocarbon group. The substrate has on the surface thereof a hydrophilic first region, a second region coated with a hydrocarbon group, and a third region coated with a fluorocarbon group. The method of the present invention includes the steps of; (1) applying a solution containing the first substance and an aqueous solvent to the substrate; (2) removing the aqueous solvent from the surface of the substrate so as to dispose the first substance on a surface of the first region; (3) dipping the substrate in a liquid containing alcohol having fluorine in its molecule; (4) applying a solution containing the second substance and an organic solvent to the surface of the substrate that has been dipped in the liquid; (5) pulling the substrate out of the liquid; and (6) removing the organic solvent from the surface of the substrate so as to dispose the second substance on a surface of the second region.

4 Claims, 10 Drawing Sheets

U.S. PATENT DOCUMENTS

| | | | |
|---|---|---|---|
| 2004/0102050 A1* | 5/2004 | Delamarche et al. | 438/734 |
| 2007/0105396 A1 | 5/2007 | Li et al. | |
| 2007/0178280 A1 | 8/2007 | Bower et al. | |
| 2007/0269883 A1* | 11/2007 | Uhrich | 435/287.2 |
| 2009/0081480 A1 | 3/2009 | Takeda et al. | |
| 2009/0265929 A1 | 10/2009 | Nakagawa et al. | |

FOREIGN PATENT DOCUMENTS

| | | |
|---|---|---|
| JP | 3541625 B2 | 7/2004 |
| JP | 2006-140376 | 6/2006 |
| JP | 2006-318850 | 11/2006 |
| JP | 3858809 B2 | 12/2006 |
| JP | 2007-500587 | 1/2007 |
| JP | 2007-129227 | 5/2007 |
| WO | WO 2007/037381 A1 | 4/2007 |

OTHER PUBLICATIONS

Hartmann, D.M., et al., "Characterization of a polymer microlens fabricated by use of the hydrophobic effect", Jul. 1, 2000, pp. 975-977, Optics Letters, vol. 25 No. 13, Optical Society of American.

Chen, F-C., et al., "Self-Organization of Microlens Arrays Caused by the Spin-Coating-Assisted Hydrophobic Effect", IEEE Photonics Technology Letters, Dec. 1, 2006, pp. 2454-2456, vol. 18 No. 23, IEEE.

* cited by examiner

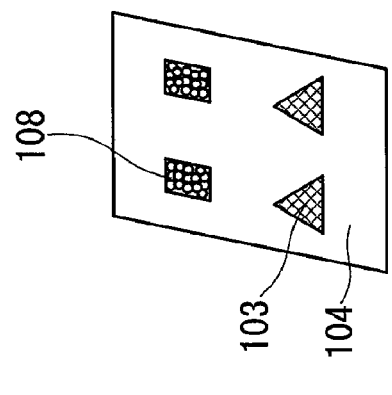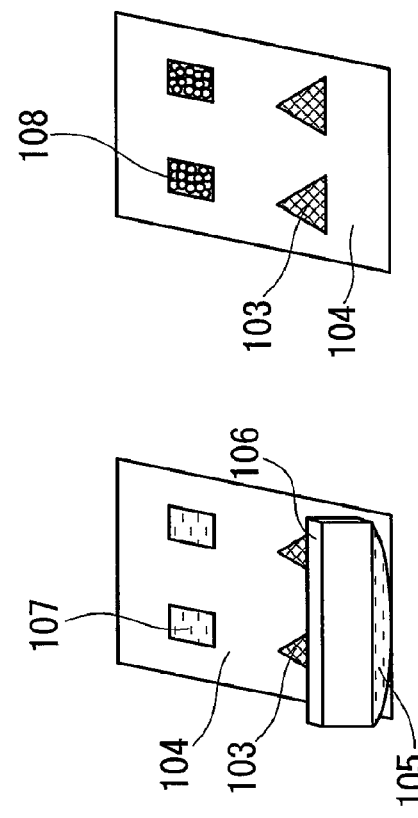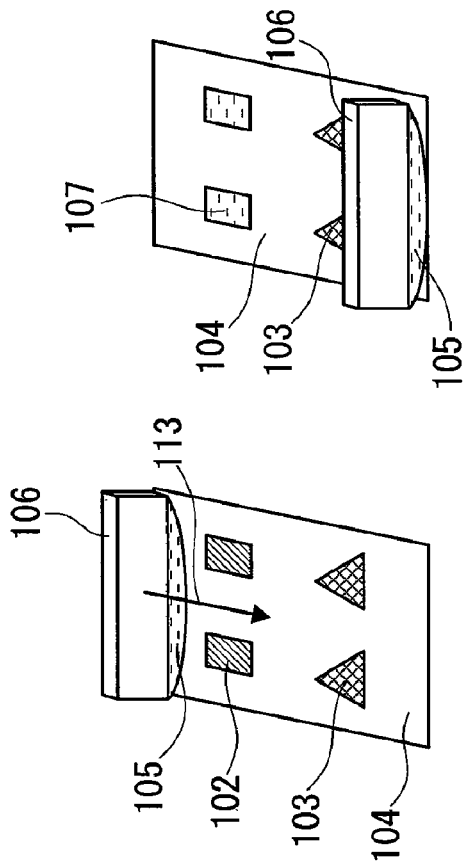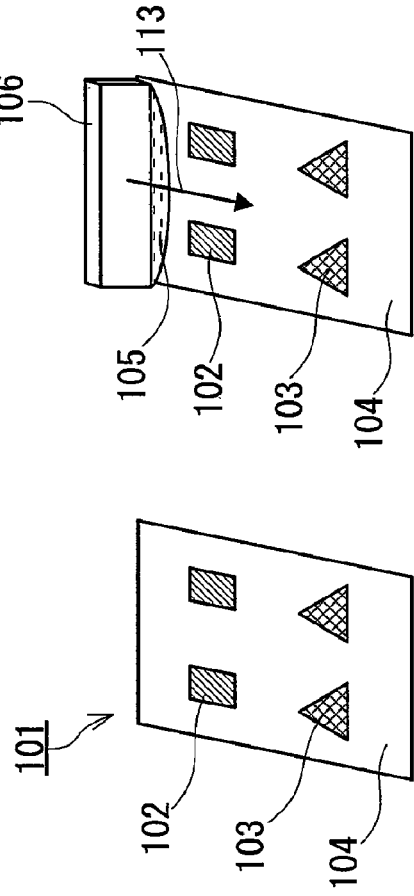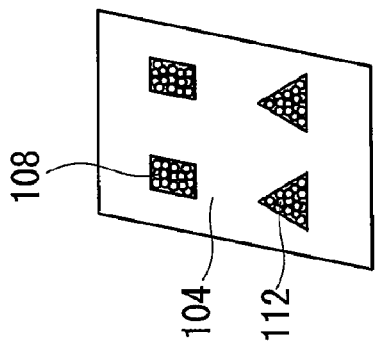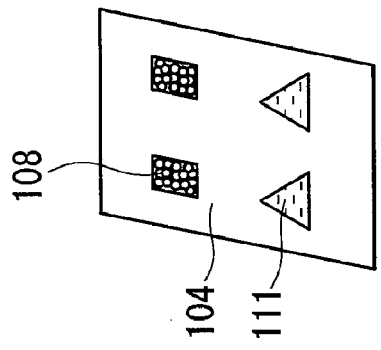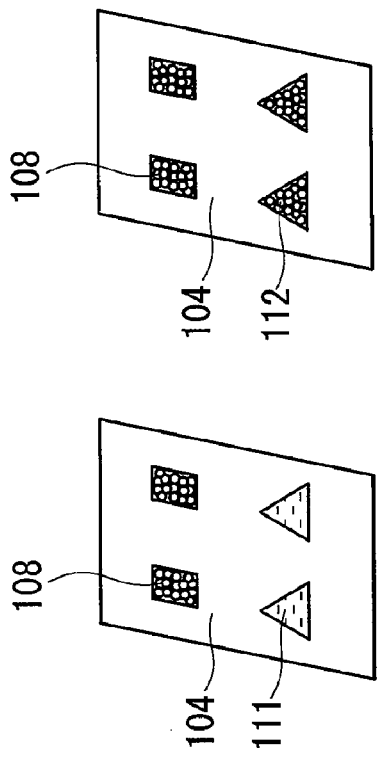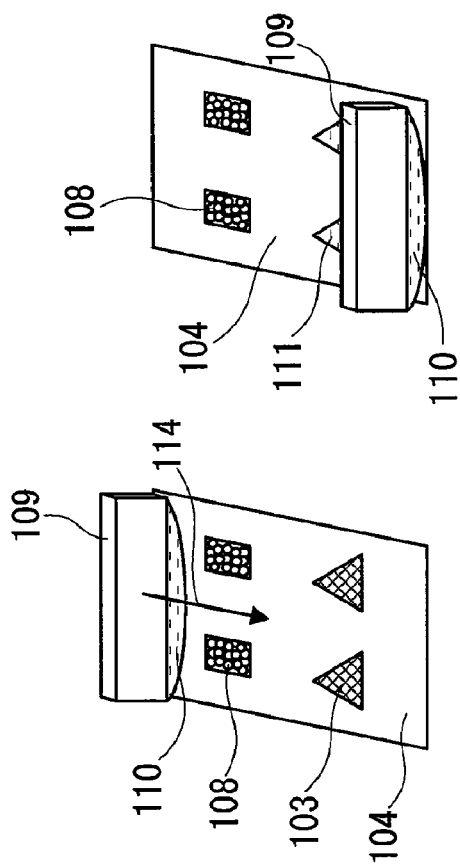

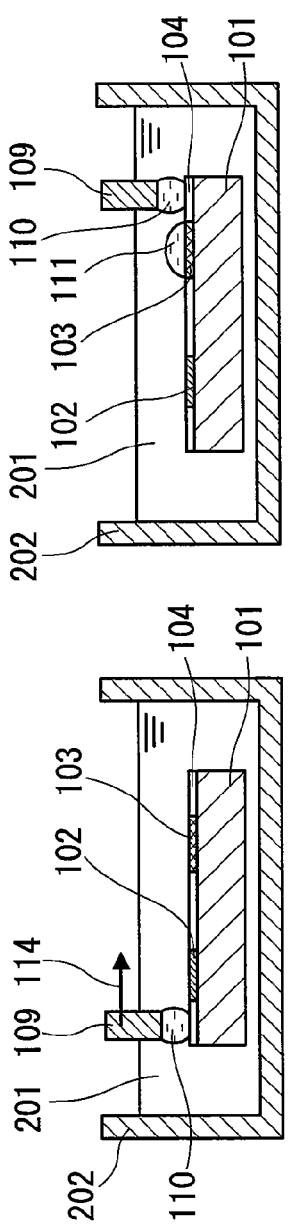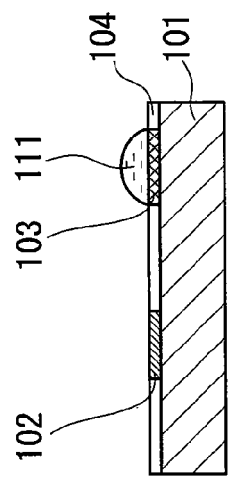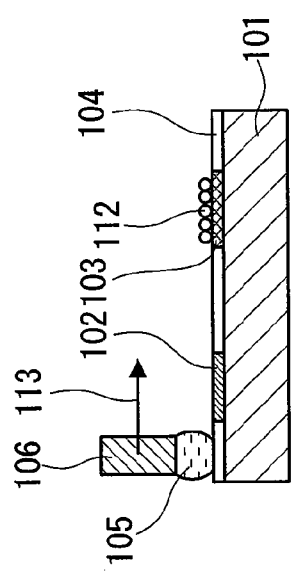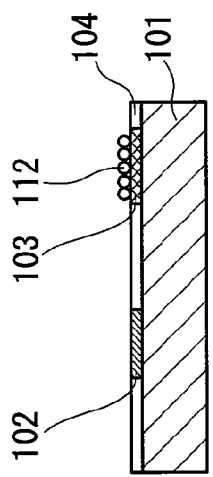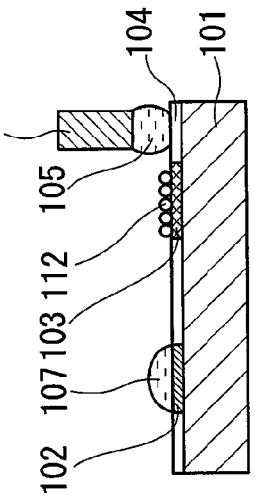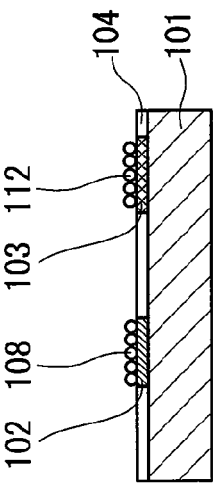

METHOD OF DISPOSING SELECTIVELY TWO TYPES OF SUBSTANCES ON SURFACE OF SUBSTRATE

This application is a continuation of International Application No. PCT/JP2009/001179, whose international filing date is Mar. 17, 2009 which in turn claims the benefit of Japanese Patent Application No. 2008-091076, filed on Mar. 31, 2008, the disclosures of which Applications are incorporated by reference herein. The benefit of the filing and priority dates of the International and Japanese Applications is respectfully requested.

BACKGROUND OF THE INVENTION

1. Field of the Invention

The present invention relates to a method of disposing selectively two types of substances on the surface of a substrate.

2. Description of Related Art

In recent years, intensive research and development efforts have been made in various sectors to fabricate electronic devices, such as thin-film transistors, light-emitting display elements, and microlenses, by a printing method instead of a conventional photolithography method. The reason why a printing method has attracted attention as a method of fabricating electronic devices is as follows. Since the components of an electronic device can be formed directly on a substrate if a printing method is used, both the number of fabrication steps and the number of materials to be used can be reduced compared to when the photolithography method is used. As a result, the cost of manufacturing electronic devices may be reduced significantly.

The size of a thin-film transistor, a light-emitting element, or a microlens generally is several tens to 100 μm. Therefore, the formation of such an electronic device by a printing method requires a printer capable of forming a pattern of several tens to 100 μm in size. Among various types of printers, an ink jet printer and a gravure offset printer can form a pattern as small as several tens μm in size, and there has been reported methods of fabricating electronic devices using these printers.

JP 3541625 B2 (Document 1) and JP 3858809 B2 (Document 2) each disclose a method of fabricating a light-emitting element for an organic electroluminescence display by an ink jet printing method. JP 2006-318850 A (Document 3) discloses a method of fabricating a light-emitting element for an organic electroluminescence display by a gravure offset printing method.

As another printing method, there has been proposed a method in which hydrophilic regions surrounded by a water-repellent region are formed on a substrate in advance, and an ink is applied to the substrate by a spin coating method or a dipping method, or using a brush, so as to dispose the ink selectively onto the hydrophilic regions. Hereinafter, this method is referred to as a dewetting method.

In recent years, the dewetting method has attracted attention as a method of fabricating electronic devices. The principle of the dewetting method is described briefly below, and then conventional examples using this method are shown.

The basic procedure of the dewetting method includes a step of bringing an ink into contact with a substrate, and a step of separating the ink from the substrate.

FIG. 10A to FIG. 10E are schematic cross-sectional views showing how the ink is disposed in a hydrophilic region in this basic procedure.

FIG. 10A is a schematic cross-sectional view showing a movement of a droplet of an ink 122 that has been brought into contact with a substrate 121 in air 130. The droplet of the ink 122 moves in the direction of an arrow 123. According to the movement of the droplet, the ink 122 is brought into contact with the surface of the substrate 121 and then separated therefrom. In FIG. 10A, according to the movement of the ink 122, a common interface 128 at which three interfaces among the ink 122, the substrate 121 and the air 130 contact with each other moves in the direction of the arrow 123.

FIG. 10B to FIG. 10E are enlarged views of the vicinity 124 (see FIG. 10A) of the common interface 128. FIG. 10B shows the beginning of the movement of the ink 122. At this point in time, the common interface 128 is located on the water-repellent region 125. Then, as shown in FIG. 10C, the common interface 128 moves on the water-repellent region 125 as the ink 122 moves, and reaches the boundary between the hydrophilic region 126 and the water-repellent region 125.

As the ink 122 further moves, the center of the gravity of the entire ink 122 also moves in the direction of the arrow 123 as shown in FIG. 10D, but the common interface 128 stays on the boundary between the water-repellent region 125 and the hydrophilic region 126.

As shown in FIG. 10B and FIG. 10C, the common interface 128 on the water-repellent region 125 moves according to the movement of the ink 122. On the other hand, as shown in FIG. 10D, the common interface 128 on the boundary between the hydrophilic region 126 and the water-repellent region 125 stays there. Presumably, this is because the adhesion that acts between the ink 122 and the water-repellent region 125 is weaker than the adhesion that acts between the ink 122 and the hydrophilic region 126.

As used herein this specification, the phrase "the adhesion that acts between a liquid (ink in the above case) and a water-repellent region is weaker than the adhesion that acts between the liquid and a hydrophilic region" means that the amount of work required to separate the liquid that has adhered to a unit area of the water-repellent region is smaller than the amount of work required to separate the liquid that has adhered to a unit area of the hydrophilic region.

Next, as shown in FIG. 10E, as the ink 122 further moves, a part of the ink 122 is cut and disposed in the hydrophilic region 126. Subsequently, the common interface 128 is located on the water-repellent region 125 adjacent to the hydrophilic region 126 in the direction of the movement 123 of the ink 122.

When the spacing between the adjacent two hydrophilic regions 126 and 129 is small, the common interface 128 may move to the next hydrophilic region 129, in some cases, upon cutting the ink 122 on the hydrophilic region 126.

In the example shown in FIG. 10A to FIG. 10E, the ink is brought into contact with the substrate and separated therefrom according to the movement of the ink droplet on the substrate.

Such contact and separation of the ink also can be performed by a spin coating method, a dipping method, or a brush method.

The spin coating method is a technique of applying an ink to a substrate by dropping the ink on the entire surface of the substrate and then rotating the substrate at high speed. In this method, dropping of the ink brings the ink into contact with the substrate, while a centrifugal force generated by the rotation of the substrate separates the ink from the substrate.

The dipping method is a technique of applying an ink to a substrate by dipping the substrate into the ink and then pulling up the substrate out of the ink. In this method, dipping of the substrate brings the ink into contact with the substrate, while pulling-up of the substrate separates the ink from the substrate.

The brush method is a technique of applying an ink to a substrate by moving a brush impregnated with the ink on the substrate. In this method, moving of the brush both brings the ink into contact with the substrate and separates the ink from the substrate.

JP 2007-129227 A (Document 4) and "S. P. Li et al.; Applied Physics Letters 89, 122105-1 to 3 (2006)" (Document 5) each disclose a method of fabricating a field-effect transistor using the dewetting method. In this method, hydrophilic regions corresponding to the shape of source electrodes and drain electrodes as well as a water-repellent region surrounding these hydrophilic regions are first formed on the surface of a conductive silicon substrate having a surface coated with a 100 nm thick thermal oxidized silicon film.

In this method, the hydrophilic regions and the water-repellent region are formed in the following manner.

First, a mold with a relief pattern, in which the shape of recesses correspond to the shape of source electrodes and drain electrodes, is produced using a polydimethylsiloxane (PDMS) material.

Next, this relief mold is impregnated with a solution of 1H,1H,2H,2H-perfluorododecyltrichlorosilane $(CF_3(CF_2)_7 C_2H_4SiCl_3)$, and then the mold is pressed against a substrate. The $CF_3(CF_2)_7C_2H_4SiCl_3$ impregnated into the projections is transferred onto the substrate to form a water-repellent thin film.

As a result, hydrophilic regions having the shape of electrodes and water-repellent region that surrounds the hydrophilic regions are formed on the substrate.

Subsequently, an ink in which a conductive polymer material is dissolved is applied to the substrate by the brush method, so that the conductive polymer is disposed only in the hydrophilic regions.

The resulting pattern of the conductive polymer corresponds to the source electrodes and the drain electrodes.

Next, an ink in which a polymeric organic semiconductor is dissolved is applied to the substrate by a spin coating method. As a result, a bottom-gate field-effect transistor is fabricated.

JP 2007-500587 T (Document 6) discloses a method of printing on a flexible substrate by a continuous roll-to-roll process using the dewetting method. In one example of this method, using a flexographic printing method, a fluororesin pattern is formed on the surface of a polyethylene terephthalate resin substrate, which has been undercoated with gelatin. Then, aqueous glycerol, conductive polymer, liquid crystal, or the like is formed by printing in hydrophilic regions by a hand coating method.

"Daniel M. Hartmann, Osman Kibar, and Sadik C. Esener; Optics Letters, 2000, vol. 25, pp. 975-977" (Document 7) discloses a method of fabricating a microlens by the dewetting method. In this method, a thin film pattern made of water-repellent wax is first formed on a substrate by the photolithography method, so that circular hydrophilic regions surrounded by a water-repellent region are formed.

Next, an ultraviolet curable resin is applied to this substrate by the dipping method, and then the resin is irradiated with ultraviolet rays to be cured. In this manner, microlenses with a diameter of 50 μm are formed in the hydrophilic regions.

"Fang-Chung Chen et al.; IEEE Photonics Technology Letters, 2006, 18, pp. 2454-2456," (Document 8) also discloses a method of fabricating a microlens by the dewetting method. In this method, circular hydrophilic regions surrounded by a water-repellent region are formed on a substrate by the same method as used in Document 7, an ultraviolet curable resin is applied to the substrate by the spin coating method, and then the resin is irradiated with ultraviolet rays. Thus, microlenses are fabricated.

Applicators used in the dewetting method are simple in structure and inexpensive compared with ink-jet printers and gravure offset printers. Therefore, the use of the dewetting method may enable the fabrication of electronic devices at lower cost.

Due to the processing limitation of an ink jet head and a mold, it is considered to be difficult to reduce the size of the minimum pattern to be printed by the ink jet method and the gravure offset method to less than 10 μm.

In contrast, in the dewetting method, the size of hydrophilic regions can be reduced to 1 μm or less by using a PDMS mold and the photolithography method. Therefore, the use of the dewetting method enables the printing of a pattern of 1 μm or less.

As described above, the dewetting method has attracted attention because it has a potential to print micro-patterns at low cost.

It is, however, difficult to print selectively two types of inks (two types of substances) in predetermined regions on the same substrate by the dewetting method. This is because in the dewetting method, two types of regions, that is, a water-repellent region and a hydrophilic region are formed on a substrate and a difference between the adhesion that acts between the ink and the water-repellent region and the adhesion that acts between the ink and the hydrophilic region is utilized to dispose the ink thereon.

SUMMARY OF THE INVENTION

It is an object of the present invention to provide a method of disposing selectively two types of substances on the same substrate by the dewetting method.

The present inventor has investigated the causes of the above problems and repeated various experiments to solve them, and as a result, he has come up with a method of disposing selectively two types of substances on a substrate by the dewetting method.

The first method of the present invention is a method of disposing selectively on a surface of a substrate a first substance having a hydrophilic surface and a second substance having a surface coated with a hydrocarbon group. In this method, the substrate has on the surface thereof a first region, a second region, and a third region. The first region is hydrophilic, the second region is coated with a hydrocarbon group, and the third region is coated with a fluorocarbon group. The first method of the present invention includes the steps of (1) applying a solution containing the first substance and an aqueous solvent to the substrate;

(2) removing the aqueous solvent from the surface of the substrate so as to dispose the first substance on a surface of the first region;

(3) dipping the substrate in a liquid containing alcohol having fluorine in its molecule;

(4) applying a solution containing the second substance and an organic solvent to the surface of the substrate that has been dipped in the liquid;

(5) pulling the substrate out of the liquid; and (6) removing the organic solvent from the surface of the substrate so as to dispose the second substance on a surface of the second region.

The second method of the present invention is a method of disposing selectively on a surface of a substrate a first substance having a hydrophilic surface and a second substance having a surface coated with a hydrocarbon group. In this method, the substrate has on the surface thereof a first region, a second region, and a third region. The first region is hydrophilic, the second region is coated with a hydrocarbon group, and the third region is coated with a fluorocarbon group. The second method of the present invention includes the steps of:

(1) dipping the substrate in a liquid containing alcohol having fluorine in its molecule;

(2) applying a solution containing the second substance and an organic solvent to the surface of the substrate that has been dipped in the liquid;

(3) pulling the substrate out of the liquid;

(4) removing the organic solvent from the surface of the substrate so as to dispose the second substance on a surface of the second region;

(5) applying a solution containing the first substance and an aqueous solvent to the substrate; and (6) removing the aqueous solvent from the surface of the substrate so as to dispose the first substance on a surface of the first region.

According to the first and second methods of the present invention, two types of substances can be disposed selectively on the surface of the substrate by the dewetting method. Therefore, a micro-pattern composed of two types of substances can be formed even on a large-area substrate at low cost.

BRIEF DESCRIPTION OF THE DRAWINGS

FIG. 1A to FIG. 1H are schematic diagrams showing one embodiment of a method of disposing two types of substances on a substrate according to the present invention.

FIG. 9A to FIG. 9G are schematic cross-sectional views showing one embodiment of a method of disposing two types of substances on a substrate according to the present invention.

DETAILED DESCRIPTION OF THE INVENTION

Figure 2A:
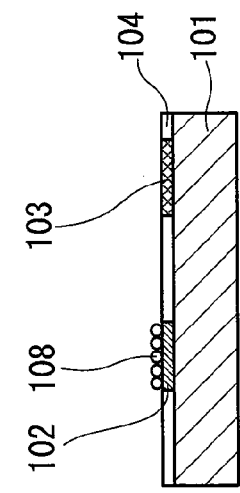
FIG. 2A to FIG. 2G are schematic cross-sectional views showing one embodiment of the method of disposing two types of substances on a substrate according to the present invention.

Hereinafter, embodiments of a method of disposing selectively two types of substances on the surface of a substrate according to the present invention will be described with reference to the accompanying drawings. In the drawings referred to in the description below, hatching may be omitted for clarity. In the following description, the same reference numerals are used to designate the same elements and parts, and overlapping description thereof may be omitted.

First Embodiment

An embodiment of the method according to the present invention will be described with reference to the schematic diagrams of FIG. 1A to FIG. 1H and FIG. 2A to FIG. 2G. It should be noted that FIG. 2A to FIG. 2G are schematic cross-sectional views corresponding to the schematic diagrams shown in FIG. 1B to FIG. 1H, respectively.

In the disposing method of the present embodiment, a substrate 101 is prepared first to dispose thereon a first substance having a hydrophilic surface and a second substance having a surface coated with hydrocarbon groups (see FIG. 1A). A first region 102, a second region 103 and a third region 104 are provided on the surface of the substrate 101. The first region 102 is hydrophilic. The second region 103 is coated with hydrocarbon groups. The third region 104 is coated with fluorocarbon groups.

Figure 2B:
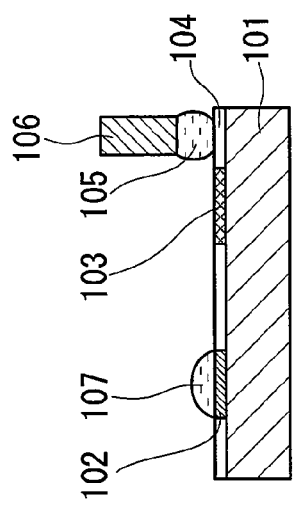

Next, as shown in FIG. 1B and FIG. 2A, a solution 105 containing a first substance and an aqueous solvent is applied to the substrate 101. In the present embodiment, a blade method is used. In this method, a blade 106 is moved in one direction 113 to apply the solution 105 onto the substrate 101. As a result of this step, as shown in FIG. 1C and FIG. 2B, the aqueous solution 105 containing the aqueous solvent is disposed only in the hydrophilic first region 102. In these diagrams, 107 indicates the solution containing both the first substance and the aqueous solvent, which has been disposed in the first region 102.

Figure 2C:
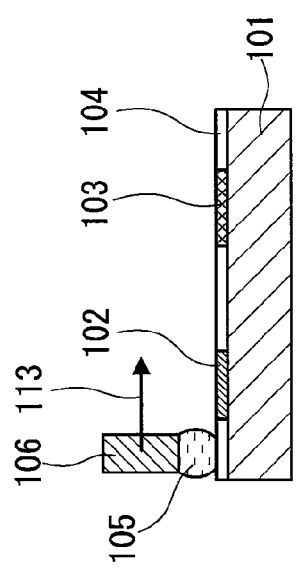

Subsequently, the aqueous solvent in the solution 107 disposed in the first region 102 is removed by heating or the like to dispose the first substance 108 contained in the solution 107 on the surface of the first region 102, as shown in FIG. 1D and FIG. 2C.

Figure 2D:
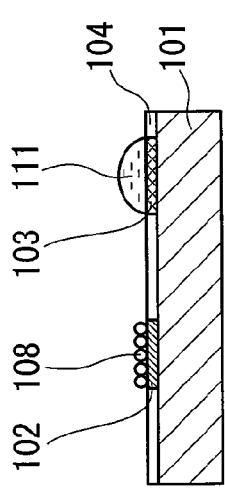
Figure 2E:
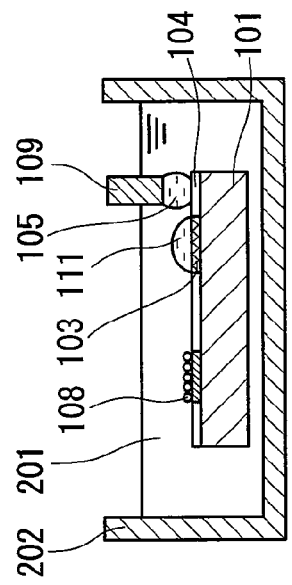

Next, the substrate 101 is dipped in a liquid 201 containing alcohol having fluorine in its molecule (for example, $CF_3CH_2OH$) held in a container 202 (see FIG. 2D). Then, as shown in FIG. 1E and FIG. 2D, a solution 110 containing a second substance and an organic solvent is applied to the surface of the substrate 101 that has been dipped in the liquid 201. In the present embodiment, the blade method is used. In this method, the blade 109 is moved in one direction 114 to apply the solution 110 onto the substrate 101. As a result of this step, as shown in FIG. 1F and FIG. 2E, the oil-soluble solution 110 containing the organic solvent is disposed only in the second region 103 having a surface coated with hydrocarbon groups. In these diagrams, 111 indicates the solution containing both the second substance and the organic solvent, which has been disposed in the second region 103. It should be noted that in FIG. 1E and FIG. 1F, the liquid 201 and the container 202 are not shown for simplicity.

Figure 2F:
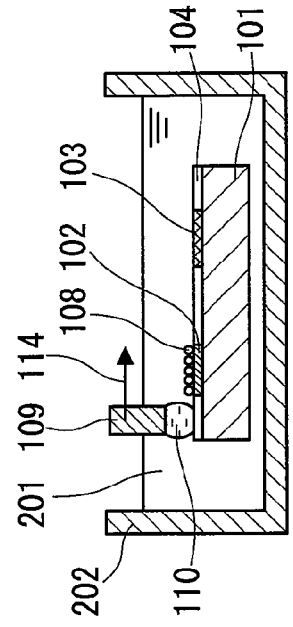
Figure 2G:
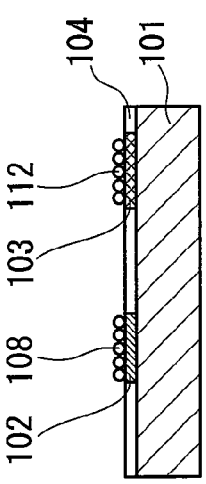

The substrate 101 is pulled out of the liquid 201 (see FIG. 1G and FIG. 2F). Subsequently, the organic solvent in the solution 111 disposed in the second region 103 is removed by heating or the like to dispose the second substance 112 contained in the solution 111 on the surface of the second region 103, as shown in FIG. 1H and FIG. 2G.

According to the disposing method of the present embodiment as described above, it is possible to dispose selectively two types of substances (the first substance and the second substance) on the surface of the same substrate. The disposing method of the present embodiment is described in more detail below.

(Preparation of Substrate on which First Substance and Second Substance are to be Disposed)

As a substrate on which a first substance and a second substance are to be disposed, a substrate 101, as shown in FIG. 1A, having a surface on which a first region 102, a second region 103, and a third region 104 are formed, is prepared. The first region 102 is a region where the first substance having a hydrophilic surface is to be disposed. The second region 103 is a region where the second substance having a surface coated with hydrocarbon groups is to be disposed.

The first region 102 has a hydrophilic surface. As used herein, "a hydrophilic surface" means that the static contact angle of a pure water droplet on the surface is less than 90 degrees.

Generally, the surface of a thoroughly washed inorganic oxide is hydrophilic. For example, glass, ceramics, metal oxides, silicon oxides, silicon oxynitrides, and the like become hydrophilic when they are washed thoroughly.

Many of resins having polar groups on their surfaces are hydrophilic. For example, the surface of a nylon resin is hydrophilic.

It also is possible to make the surfaces of resins having no polar group thereon hydrophilic by subjecting the surfaces to chemical treatment or plasma treatment. For example, it is possible to make the surfaces of resins such as a polypropylene resin, a polyethylene resin, and a polyethylene terephthalate resin hydrophilic by exposing the surfaces to oxygen plasma.

It also is possible to make the non-hydrophilic substrates hydrophilic by forming thin films of hydrophilic materials on the surfaces. For example, the surface of a silicon substrate can be rendered hydrophilic by forming a thin film of aluminum oxide thereon by vacuum evaporation. For example, the surface of a non-hydrophilic resin substrate also can be rendered hydrophilic by forming a thin film of silicon oxide thereon by vacuum evaporation.

The second region 103 is coated with hydrocarbon groups $(CH_3(CH_2)_n—$, where n is a natural number of 1 to 19). Since a hydrocarbon group is present on the surface of the second region 103, the surface energy thereof is lower than that of the first region 102.

The second region 103 having such properties can be obtained by using the surface of a polypropylene resin or a polyethylene resin without any treatment. The second region 103 also can be obtained by applying a resin having a hydrocarbon group to the substrate.

The second region 103 can be obtained also by adsorbing a molecule having a hydrocarbon group onto the substrate.

For example, by reacting a silane coupling agent having a hydrocarbon group with the substrate, molecules having hydrocarbon groups are bonded to the substrate in the form of a monomolecular film or a polymer film.

For example, a thoroughly washed glass substrate or silicon oxide substrate is dipped for a predetermined period of time in a solution in which 1 vol % of silane coupling agent is dissolved, and then pulled out of the solution. As a result, the silane coupling agent is bonded to the surface of the substrate. The silane coupling agent is bonded to the substrate in the form of a monomolecular film if the substrate is washed with a solvent after the dip, while it is bonded to the substrate in the form of a polymer film if the substrate is not washed. Examples of the silane coupling agent to be used for forming the second region 103 include $CH_3(CH_2)_nSiX_3$, $CH_3(CH_2)_nSiCH_3X_2$, and $CH_3(CH_2)_nSi(CH_3)_2X$ (where n is a natural number of 1 to 19, X is Cl, $OCH_3$ or $OCH_2CH_3$, and when two or more Xs are included, the Xs need not necessarily be the same element).

Figure 4:
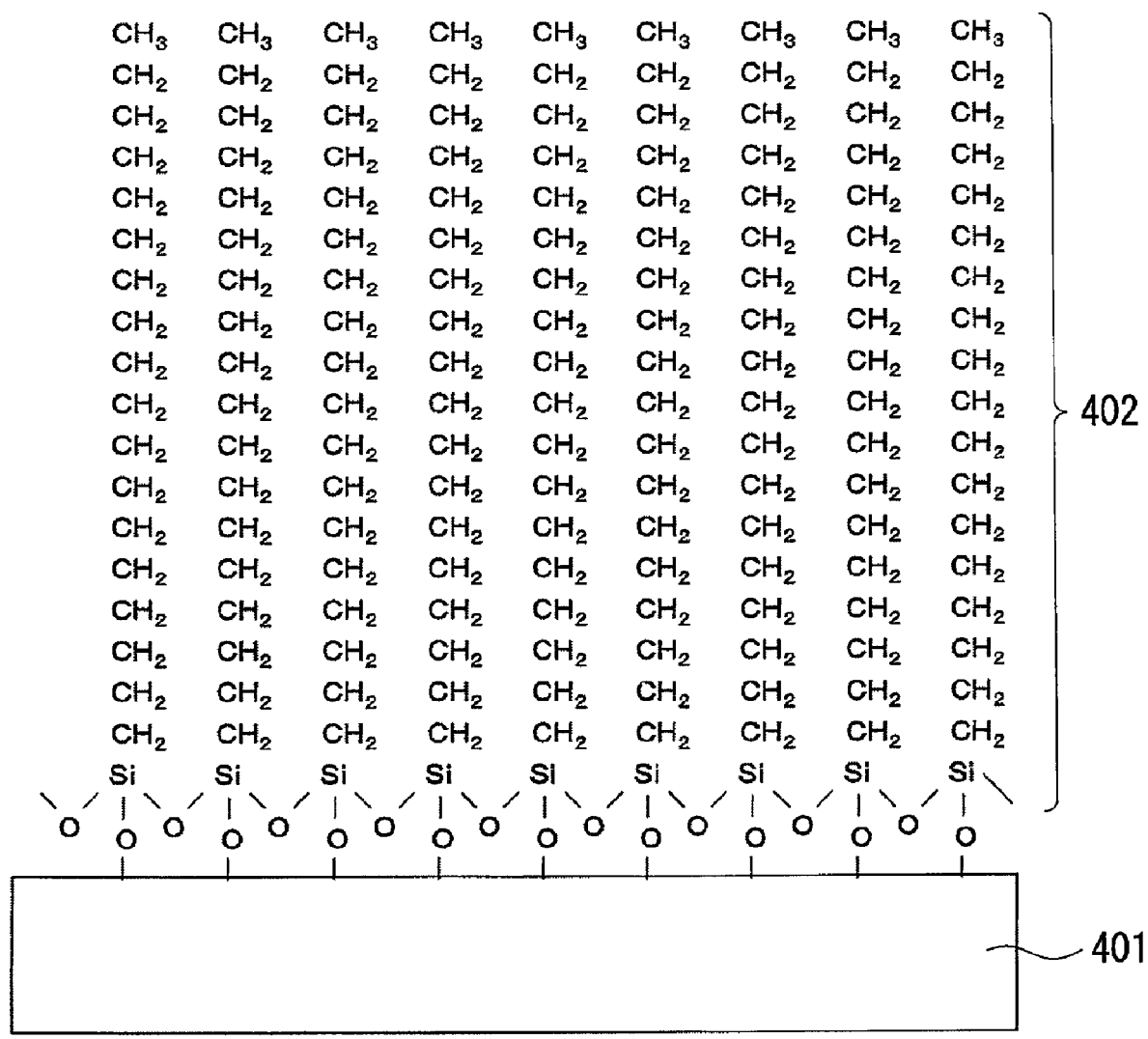
FIG. 4 is a schematic diagram of a monomolecular film having hydrocarbon groups.

FIG. 4 is a schematic view showing an example of a monomolecular film 402, which is formed by reacting a substrate 401 with octadecyltrichlorosilane ($CH_3(CH_2)_{17}SiCl_3$) as a silane coupling agent.

The third region 104 is coated with fluorocarbon groups $(CF_3(CF_2)_n—$, where n is a natural number of 0 to 10). Since a fluorocarbon group is present on the surface of the third region 104, the surface energy thereof is lower than that of the first region 102. The third region 104 having such properties can be obtained by applying a resin having a fluorocarbon group onto the substrate 101. The third region 104 also can be obtained by reacting a silane coupling agent having a fluorocarbon group with the substrate 101.

For example, a solution in which Cytop ((registered trade name) manufactured by Asahi Kasei Corporation) is dissolved in a solvent is applied to the substrate 101 and then the solvent is removed by drying. Thus, a resin having a fluorocarbon group can be formed on the surface of the substrate 101.

For example, by reacting a silane coupling agent having a fluorocarbon group with the substrate 101, molecules having fluorocarbon groups can be formed on the substrate in the form of a monomolecular film or a polymer film.

For example, a thoroughly washed glass substrate or silicon oxide substrate is dipped for a predetermined period of time in a solution in which 1 vol % of silane coupling agent is dissolved, and then pulled out of the solution. As a result, the silane coupling agent is bonded to the surface of the substrate. The silane coupling agent is bonded to the substrate in the form of a monomolecular film if the substrate is washed with a solvent after the dip, while it is bonded to the substrate in the form of a polymer film if the substrate is not washed. Examples of the silane coupling agent to be used for forming the third region 104 include $CF_3(CF_2)_n(CH_2)_2SiX_3$, $CF_3(CF_2)_n(CH_2)_2SiCH_3X_2$, and $CF_3(CF_2)_n(CH_2)_2Si(CH_3)_2X$ (where n is a natural number of 1 to 10, X is Cl, $OCH_3$ or $OCH_2CH_3$, and when two or more Xs are included, the Xs need not necessarily be the same element).

Figure 5:
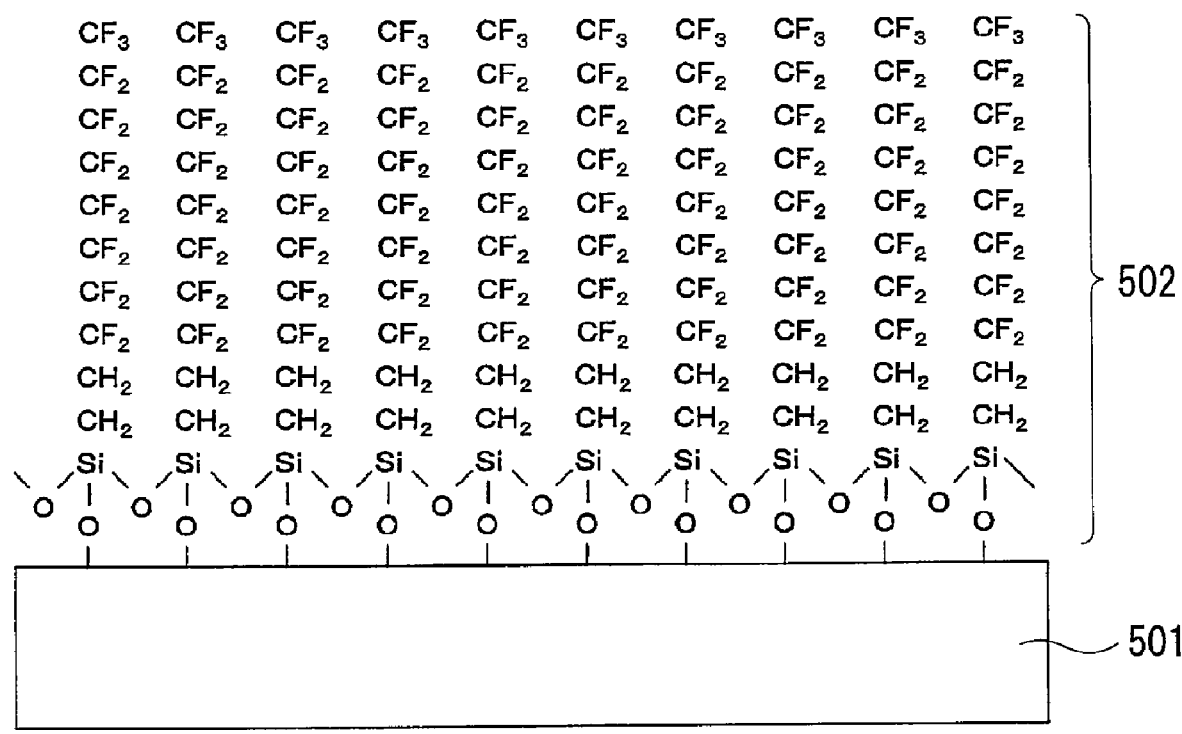
FIG. 5 is a schematic diagram of a monomolecular film having fluorocarbon groups.

FIG. 5 is a schematic view showing an example of a monomolecular film 502, which is formed by reacting a substrate 501 with perfluorooctyl ethyl-trichlorosilane ($CF_3(CF_2)_7(CH_2)_2SiCl_3$, hereinafter referred to as "FAS") as a silane coupling agent.

As a method of forming the first, second and third regions on the surface of the same substrate, for example, the photolithography method can be used.

FIG. 3A to FIG. 3E show one example of a method of forming the first, second and third regions by the photolithography method.

Figure 3D:
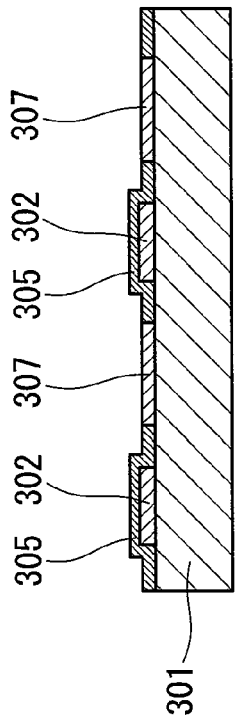
FIG. 3A to FIG. 3E are schematic cross-sectional views showing one example of a method of fabricating a substrate having on its surface first, second and third regions in the present invention.
Figure 3E:
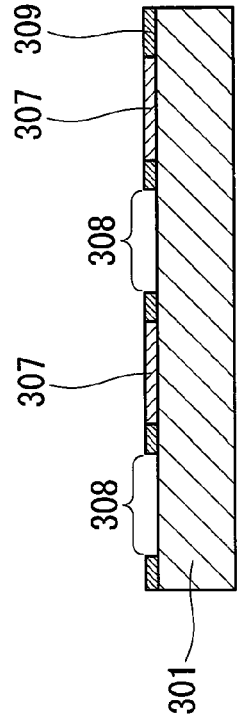
Figure 3A:
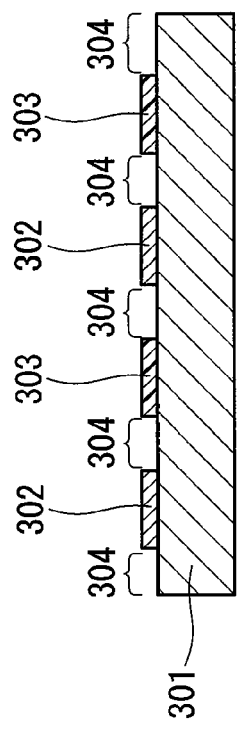

As shown in FIG. 3A, a predetermined pattern of a metal film 302 and a positive resist film 303 is formed using the photolithography method on a substrate 301 having a hydrophilic surface.

As the hydrophilic substrate 301, glass, silicon coated with an oxide film, ceramics, a metal oxide, a nylon resin, a resin having a hydrophilic surface obtained by an oxygen plasma treatment or the like can be used.

The type of metal that constitutes the metal film 302 is not particularly limited, and noble metals such as gold and platinum, aluminum, copper, nickel, and the like can be used.

Next, a silane coupling agent (hereinafter referred to as a silane coupling agent (A)) having a fluorocarbon group is reacted with the surface of the substrate 301. Examples of the silane coupling agent (A) include $CF_3(CF_2)_n(CH_2)_2SiX_3$, $CF_3(CF_2)_n(CH_2)_2SiCH_3X_2$, and $CF_3(CF_2)_n(CH_2)_2Si(CH_3)_2X$ (where n is a natural number of 1 to 10, X is Cl, $OCH_3$ or $OCH_2CH_3$, and when two or more Xs are included, the Xs need not necessarily be the same element).

Particularly, the silane coupling agent (A) containing Cl as X is used preferably because it has high reactivity with the substrate 301 and fluorocarbon groups can be formed in high density on the surface of the substrate 301.

The silane coupling agent (A) is bonded to the substrate 301 by, for example, dipping for at least one hour the substrate 301 in a solution in which 1 vol % of the silane coupling agent (A) is dissolved in a non-aqueous organic solvent and then washing it with a non-aqueous organic solvent. It is preferable to use a non-aqueous organic solvent that does not modify the resist film 303. For example, a fluorine-based solvent such as perfluorooctane is used preferably.

Figure 3B:
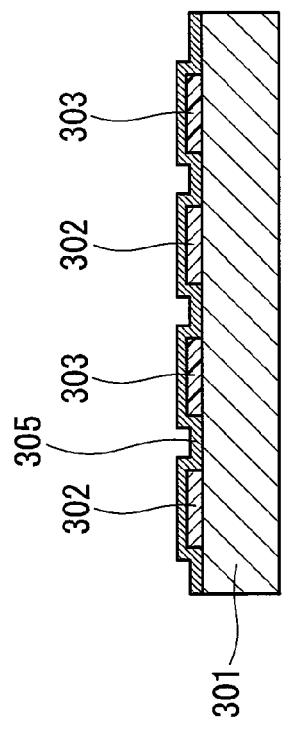

FIG. 3B is a schematic cross-sectional view of the substrate 301 with which the silane coupling agent (A) has been reacted. As a result of this step, molecules having fluorocarbon groups are bonded to a region 304 where the surface of the substrate 301 is exposed, so that a monomolecular film 305 is formed.

This diagram shows the case where the monomolecular film 305 is formed on both the surfaces of the metal film 302 and the resist film 303. The silane coupling agent (A), however, is bonded to the surface of the metal film 302 and the surface of the resist film 303 in some cases, and is not bonded thereto in the other cases. For example, when the metal film 302 is made of gold or platinum, the metal has on its surface no active hydrogen that reacts with the silane coupling agent (A), and therefore the silane coupling agent (A) is not bonded to the surface.

Figure 3C:
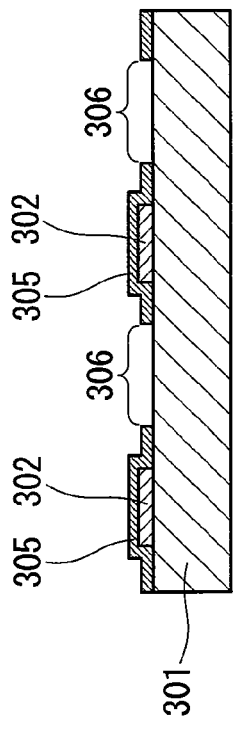

Next, the resist film 303 is removed. When the resist film 303 is a positive resist, it can be dissolved and removed by exposing the surface of the substrate 301 to acetone. As a result, as shown in FIG. 3C, a region 306 where the surface of the substrate 301 is exposed appears in the region where the resist film 303 has been formed.

Next, the substrate 301 is reacted with a silane coupling agent (hereinafter referred to as a silane coupling agent (B)) having a hydrocarbon group. Examples of the silane coupling agent (B) include $CH_3(CH_2)_nSiX_3$, $CH_3(CH_2)_nSiCH_3X_2$, and $CH_3(CH_2)_nSi(CH_3)_2X$ (where n is a natural number of 1 to 19, X is Cl, $OCH_3$ or $OCH_2CH_3$, and when two or more Xs are included, the Xs need not necessarily be the same element). Particularly, the silane coupling agent (B) containing Cl as X is used preferably because it has high reactivity with the substrate 301 and hydrocarbon groups can be formed in high density on the surface of the substrate 301.

The silane coupling agent (B) is bonded to the substrate 301 by, for example, the steps of dipping for at least one hour the substrate 301 in a solution in which 1 vol % of the silane coupling agent (B) is dissolved in a non-aqueous organic solvent and then washing it with a non-aqueous organic solvent. Examples of the non-aqueous organic solvent that can be used include chloroform, toluene, hexadecane, and a mixed solution of chloroform and hexadecane.

As a result of these steps, as shown in FIG. 3D, molecules having hydrocarbon groups are bonded to the region 306 where the surface of the substrate 301 is exposed, so that a monomolecular film 307 is formed.

This silane coupling agent (B) is not bonded to the region where the monomolecular film 305 having a fluorocarbon group has already been formed. This is because the surface of the region where the monomolecular film 305 has been formed is coated with fluorocarbon groups, and no active hydrogen that reacts with the silane coupling agent (B) is present thereon.

Next, the metal film 302 is removed by etching, and as a result, a region 308 where the surface of the substrate 301 is exposed is formed, as shown in FIG. 3E.

Here, it is preferable to use an acid etchant. The silane coupling agent (B) bonded to the surface of the substrate 301 is resistant to an acid solution. Therefore, in the step of etching the metal film 302 using the acid etchant, the monomolecular film 305 and the monomolecular film 307 are never be removed from the substrate 301.

When the silane coupling agent (B) is bonded in high density to the surface of the metal film 302, the silane coupling agent (B) serves as a resist film to the etchant. In this case, the etching of the metal film 302 takes a longer time than the metal film 302 to which the silane coupling agent (B) is not bonded.

When the metal film 302 is made of noble metal, the silane coupling agent (B) is hardly bonded to the surface thereof. In this case, the etching of the metal film 302 takes a shorter time than the metal film 302 made of a metal to which the silan coupling agent (B) is bonded easily.

By the steps shown in FIG. 3A to FIG. 3E, a hydrophilic region 308 where the surface of the substrate 301 is exposed, a region where the monomolecular film 307 having a hydrocarbon group is provided, and a region where the monomolecular film 309 having a fluorocarbon group is provided are formed on the surface of the substrate 301. Accordingly, the hydrophilic region 308, the region of the monomolecular film 307 having a hydrocarbon group, and the region of the monomolecular film 309 having a fluorocarbon group serve as the first region, the second region, and the third region, respectively.

In the example described above, the first region corresponds to the surface of the substrate, but it is also possible to fabricate a substrate having the first to third regions, in which the second region corresponds to the surface of the substrate.

For example, a predetermined region in a resin substrate made of polyethylene or polypropylene is rendered hydrophilic by exposing the substrate to oxygen plasma through a metal mask. The pattern of the metal mask is formed in advance so that the region on the substrate, which is not to be exposed to plasma, corresponds to the second region.

Since hydrocarbon groups are present on the surface of the resin substrate, the region that is not to be exposed to plasma serves as the second region. Subsequently, the resist pattern corresponding to the first region in shape is formed in the hydrophilic region by the photolithography method.

Next, the silane coupling agent having a fluorocarbon group is reacted with the substrate, and then the resist pattern is removed. Thus, the substrate having the first to third regions can be fabricated.

It is also possible to fabricate a substrate having the first to third regions, in which the third region serves as the surface of the substrate.

For example, a predetermined region in a resin substrate made of polytetrafluoroethylene is rendered hydrophilic by irradiating the substrate with an excimer laser through a metal mask in an oxygen atmosphere. The pattern of the metal mask is formed in advance so that the region on the substrate, which is not to be exposed to laser, corresponds to the third region.

Since this resin substrate has fluorocarbon groups on its surface, the region that is not to be exposed to laser serves as the third region.

Subsequently, the resist pattern corresponding to the first region in shape is formed in the hydrophilic region by the photolithography method. Next, the silane coupling agent having a hydrocarbon group is reacted with the substrate, and then the resist pattern is removed. Thus, the substrate having the first to third regions can be fabricated.

The substrate having the first to third regions also can be fabricated by a method using a mold made of PDMS.

First, a first PDMS relief mold (first relief mold) having the same size as the surface of a substrate on which the first substance and the second substance are to be disposed is fabricated. This first relief mold is fabricated such that the positions and shape of projections thereon coincide with the positions and shape of the second regions on the surface of the substrate.

The surface of the first relief mold is impregnated with the silane coupling agent having a hydrocarbon group, and then this relief mold is brought into contact with the substrate having the hydrophilic surface. As a result, the silane coupling agent having a hydrocarbon group is bonded to the substrate, and thus the second regions are formed.

Next, a second PDMS relief mold (second relief mold) having the same size as the surface of the substrate is prepared. This second relief mold is formed such that the positions and shape of recesses thereon coincide with the positions and shape of the first regions on the surface of the substrate.

The surface of the second relief mold is impregnated with the silane coupling agent having a fluorocarbon group, and then the relief mold is brought into contact with the substrate. Here, the positional relationship between the second relief mold and the substrate is determined such that the positions of the recesses on the second relief mold coincide with the positions of the first regions on the substrate. In this manner, the first to third regions can be formed on the substrate.

(Preparation of Solution Containing First Substance and Aqueous Solvent)

A solution containing a first substance and an aqueous solvent, in which the first substance is dispersed in the aqueous solvent, (where the solution corresponds to the solution 105 shown in FIG. 1B, FIG. 1C, FIG. 2A, and FIG. 2B, and may be referred to as a solution (A) in the present embodiment) is prepared. In the present invention, an aqueous solvent means a liquid containing water. Preferably, the aqueous solvent contains at least 40 vol % of water. More preferably, the aqueous solvent is water, that is, the solution (A) is an aqueous solution of the first substance.

It is preferable that the static contact angle of the surface of the first region with respect to the aqueous solvent thereon is less than 90 degrees. It is preferable that the static contact angle of the surface of the second or third region with respect to the aqueous solvent thereon is at least 90 degrees. Examples of such an aqueous solvent include water containing 10 vol % or less alcohol such as propyl alcohol and butyl alcohol, or pure water.

As the first substance in the present invention, particles of an inorganic material or a resin material having a hydrophilic surface can be used. The shape and size of the particles are not particularly limited. Preferably, the longest side or the maximum diameter of the particles is at least 1 nm but not more than 100 μm.

Since the surface of the first substance is hydrophilic, the first substance can be dispersed in the aqueous solvent.

As used herein, "the surface of the first substance is hydrophilic" means that when a solution in which the first substance is dispersed in an aqueous solvent is applied to a smooth substrate surface and the aqueous solvent is removed by volatilization so as to form a film of the first substance, the static contact angle of the film of the first substance with respect to pure water thereon is 90 degrees or less.

Examples of particles of inorganic materials to be used as the first substance include particles of semiconductors such as silicon, germanium, titanium oxide and indium oxide, particles of insulators such as silicon oxide and silicon nitride, and particles of metals such as gold, silver and copper.

Examples of particles of resin materials to be used as the first substance include particles of resins such as polystyrene and nylon resins.

When the surface of the particles is not hydrophilic, it can be rendered hydrophilic by exposing it to oxygen plasma or ozone gas, or subjecting it to chemical treatment.

The solution (A) can be obtained by adding the first substance in an aqueous solvent and stirring the mixture or applying an ultrasonic wave thereto.

(Preparation of Solution Containing Second Substance and Organic Solvent)

A solution containing a second substance and an organic solvent, in which the second substance is dispersed in the organic solvent, (where the solution corresponds to the solution 110 shown in FIG. 1E, FIG. 1F, FIG. 2D, and FIG. 2E, and may be referred to as a solution (B) in the present embodiment) is prepared. In the present invention, an organic solvent means a liquid having a hydrocarbon group and having solubility to water (weight of the solvent dissolved in 100 g of water) of 10 g or less. Examples of the liquid include alkane having 6 to 16 carbon atoms, cyclohexane, and turpentine oil.

As the second substance in the present invention, particles of an inorganic material or a resin material having a surface coated with hydrocarbon groups can be used. The shape and size of the particles are not particularly limited. Preferably, the longest side or the maximum diameter of the particles is at least 1 nm but not more than 100 μm.

Since hydrocarbon groups are present on the surface of the second substance, the second substance can be dispersed in the organic solvent.

Examples of particles of inorganic materials to be used as the second substance include particles of semiconductors such as silicon, germanium, titanium oxide and indium oxide, particles of insulators such as silicon oxide and silicon nitride, and particles of metals such as gold, silver and copper. Examples of particles of resin materials include particles of resins such as a polystyrene resin, a nylon resin, a polypropylene resin and a polyethylene resin. In order to disperse these particles in an organic solvent, the surfaces of the particles are modified chemically.

For example, the surfaces of silicon oxide particles can be modified by the method proposed by Hiroshi Utsugi et al. and Kondo et al. (Utsugi et al., Zairyo (Materials), vol. 24, No. 262, pp. 54-58; and Kondo, M. et al., Langmuir 1995, vol. 11, pp. 394-397).

This method is carried out in the following manner. Silicon oxide particles are heated in a mixed solution of tetradecane and primary alcohol ($CH_3(CH_2)_nOH$, where n is a natural number of 3 to 16). As a result, hydrocarbon groups are bonded to the surfaces of the particles through a dehydration reaction between hydroxyl groups of alcohol molecules and silanol groups (Si—OH) on the surfaces of particles. Subsequently, the mixed solution is removed by volatilization. Thus, particles having surfaces to which hydrocarbon groups are bonded can be obtained.

The surfaces of particles of a material other than silicon oxide also can be modified chemically by the above-mentioned method as long as they are inorganic particles having oxide films formed on their surfaces. On the other hand, in the case of particles having no oxide film formed on their surfaces, the surfaces can be modified chemically by the above-mentioned method after the surfaces are exposed to oxygen plasma or ozone gas to form thin oxide films thereon. In the case of particles of a resin material, the surfaces thereof can be modified chemically by the above-mentioned method after hydroxyl groups are introduced into the surfaces by irradiating them with oxygen plasma.

The method of chemical modification is not limited to the above-mentioned method, and the surfaces of silicon oxide particles also can be modified chemically using a silane coupling agent having a hydrocarbon group. Examples of such a silane coupling agent include $CH_3(CH_2)_nSiX_3$, $CH_3(CH_2)_nSiCH_3X_2$, and $CH_3(CH_2)_nSi(CH_3)_2X$ (where n is a natural number of 1 to 19, X is Cl, $OCH_3$ or $OCH_2CH_3$, and when two or more Xs are included, the Xs need not necessarily be the same element).

For example, a silane coupling agent can be bonded to the surfaces of silicon oxide particles by dipping the particles in a mixed solution of the silane coupling agent and hexane.

Subsequently, the particles are separated from the mixed solution with a centrifugal separator. Thus, the particles having surfaces coated with hydrocarbon groups can be obtained.

The surfaces of particles of a material other than silicon oxide also can be modified chemically in the same manner if they are inorganic particles having oxide films formed on their surfaces.

In the case of particles of an inorganic material having no oxide film formed on their surfaces, the surfaces can be modified chemically by the above-mentioned method after the surfaces are exposed to oxygen plasma or ozone gas to form thin oxide films thereon.

In the case of particles of a resin material, the surfaces thereof can be modified chemically by the above-mentioned method after hydroxyl groups are introduced into the surfaces by irradiating them with oxygen plasma.

In the case where the second substance is particles made of a metal such as gold, silver and copper, alkyl mercaptan ($CH_3(CH_2)_nSH$, where n is a natural number of 1 to 19) can be bonded to the surfaces of the particles by dipping the particles in a mixed solution of alkyl mercaptan and alcohol.

Subsequently, the particles are separated from the mixed solution with a centrifugal separator. Thus, the metal particles having surfaces coated with hydrocarbon groups can be obtained.

Particles made of polypropylene or polyethylene can be dispersed in an organic solvent without any particular surface treatment because hydrocarbon groups are present on the surfaces thereof.

The solution (B) can be obtained by adding the second substance (particles having chemically modified surfaces as described above or particles of a resin material having surfaces on which hydrocarbon groups are present) in an organic solvent and stirring the mixture or applying an ultrasonic wave thereto.

(Disposition of First Substance)

In order to dispose the first substance in the first region 102, as shown in FIG. 1B, FIG. 1C, FIG. 2A, and FIG. 2B, the solution 105 in which the first substance is dispersed is applied to the surface of the substrate 101.

In the present embodiment, the solution 105 is applied using a blade 106. The shape of the blade 106 is not limited, and a plate-like blade is used commonly. The blade 106 is placed with a predetermined spacing from the substrate 101 so that one end face of the blade 106 is parallel to the surface of the substrate 101. The solution 105 in which the first substance is dispersed is placed in the form of a curtain-like liquid film between the end face of the blade 106 and the surface of the substrate 101. The blade is moved in one direction 113 to maintain the curtain shape. Thus, the liquid is applied.

The method of applying the solution 105 is not limited to the blade method, and a commonly used method of applying a solution onto a substrate, such as a spin coating method, a brush method, a slit coating method, and a dye coating method, can be used.

As a result of this step, the solution containing the first substance is disposed only in the first region 102.

Conceivably, the reason why the solution 105 is disposed only in the first region 102 is that the adhesion between the aqueous solvent in the solution 105 and the second region 103 or the third region 104 is weaker than that between the aqueous solvent in the solution 105 and the first region 102. This relationship of the adhesion is developed because the second region 103 and the third region 104 have lower surface energies than the first region 102.

Subsequently, the aqueous solvent in the solution 105 is removed. Thus, as shown in FIG. 1D and FIG. 2C, the first substance 108 is disposed in the first regions 102. The aqueous solvent can be removed by volatilization by allowing the substrate 101 to stand in air, heating the substrate 101 in air, or placing the substrate 101 in a reduced pressure atmosphere.

(Disposition of Second Substance)

In order to dispose the second substance in the second region 103, as shown in FIG. 1E, FIG. 1F, FIG. 2D and FIG. 2E, the substrate 101 is dipped into a container 202 holding a liquid 201 containing alcohol having fluorine (F) in its molecule and the solution 110 containing the second substance is applied to the substrate 101 that has been dipped in the container 202.

The liquid 201 must not dissolve the solution 110. The liquid 201 contains alcohol having fluorine (F) in its molecule, and the liquid consisting of the alcohol is used suitably. Preferably, this alcohol is 2,2,2-trifluoroethanol ($CF_3CH_2OH$).

The method of exposing the substrate 101 to the liquid 201 is not particularly limited. Only the vicinity of the area to be applied with the solution 110 may be exposed to the liquid 201.

The solution containing the second substance can be applied in the same manner as the method of applying the solution 105 containing the first substance. The solution 110 is disposed only in the second region 103.

Subsequently, as shown in FIG. 1G, FIG. 1H, FIG. 2F and FIG. 2G, the substrate 101 is pulled out of the container and the organic solvent in the solution 110 is removed. Thus, the second substance 112 is disposed in the second region 103. The organic solvent can be removed by volatilization by allowing the substrate 101 to stand in air, heating the substrate 101 in air, or placing the substrate 101 in a reduced pressure atmosphere.

(Principle on which Second Substance is Disposed Only in Second Region)

As for the principle on which the solution 110 containing a hydrocarbon group is disposed only in the second region 103 in the steps shown in FIG. 1E, FIG. 1F, FIG. 2D and FIG. 2E, the present inventor presumes as follows. It has been known that the adhesion hardly acts between a molecule having a fluorocarbon group and a molecule having a hydrocarbon group in alcohol (Nakagawa, T. et al., Journal of Vacuum Science of Technology B, 1994, No. 12, pp. 2215-2218).

Since the second region 103 coated with hydrocarbon groups and the organic solvent in the solution 110 have the same chemical properties, they should have affinity for each other. Therefore, in the liquid 201 containing alcohol, the adhesion between the solution 110 and the third region 104 coated with fluorocarbon groups is weak compared to the adhesion between the solution 110 and the second region 103. As a result, it is presumed that in the liquid 201, the solution 110 is disposed in the second region 103 but is not disposed in the third region 104.

On the other hand, since the first substance 108 is disposed in the first region 102, the surface of the first region 102 is hydrophilic. The present inventor presumes that when the first region 102 is exposed to alcohol containing fluorine (F) in its molecule, alcohol molecules in the form of a monomolecular film, in which fluorocarbon groups ($CF_3(CF_2)_n$—) are oriented toward the liquid, are adsorbed to the hydrophilic region. For this reason, in the liquid 201, the surface of the first region 102 has chemical properties similar to those of the third region 104. As a result, it is presumed that in the liquid 201, the solution 110 is not disposed in the first region 102.

Presumably, the solution 110 is disposed selectively only in the second region 103 on the principle described above.

Second Embodiment

The method of disposing two types of substances on a substrate in the second embodiment is the same as the disposing method in the first embodiment except that the second substance is disposed in the second region of the substrate in the preceding step and then the first substance is disposed in the first region in the following step. The method of the present embodiment is described below with reference to the schematic cross-sectional views of FIG. 9A to FIG. 9G. The same reference numerals are used to designate the same components as those in the first embodiment, and overlapping description thereof is omitted.

First, the substrate 101 having the first region 102, the second region 103 and the third region 104 is dipped in the liquid 201 held in the container 202 (see FIG. 9A). The solution 110 containing the second substance and the organic solvent is applied to the surface of the substrate 101 that has been dipped in the liquid 201, as shown in FIG. 9A. The method of applying the solution 110 is the same as that described in the first embodiment. As a result of this step, the solution 110 containing a hydrocarbon group is disposed only in the second region 103 having a surface coated with hydrocarbon groups, as shown in FIG. 9B. The principle on which the solution 110 is disposed only in the second region 103 in the liquid 201 is the same as that described in the first embodiment.

The substrate 101 is pulled out of the liquid 201 (see FIG. 9C), and subsequently, the organic solvent in the solution 111 disposed in the second region 103 is removed in the same manner as in the first embodiment to dispose the second substance 112 contained in the solution 111 on the surface of the second region 103, as shown in FIG. 9D.

Next, as shown in FIG. 9E, the solution 105 containing the first substance and the aqueous solvent is applied to the substrate 101 in air. The method of applying the solution 105 is the same as that described in the first embodiment. Since hydrocarbon groups are present on the surface of the second substance 112 disposed in the second region 103, the surface energy of the second region 103 is lower than that of the first region 102. Therefore, the solution 105 is not disposed in the second region 103 but is disposed only in the first region 102, as shown in FIG. 9F.

Subsequently, the aqueous solvent in the solution 107 disposed in the first region 102 is removed in the same manner as in the first embodiment to dispose the first substance 108 contained in the solution 107 on the surface of the first region 102, as shown in FIG. 9G.

According to the method of the present embodiment described above, it is possible to dispose selectively two types of substances (a first substance and a second substance) on the surface of the same substrate.

EXAMPLES

Reference Example

In the present reference example, experiments were carried out for the purpose of verifying the principle of the method of the present invention.

(1) Preparation of Solution to be Applied

As a solution in which the first substance is dispersed in an aqueous solvent, a solution in which silicon particles with a particle diameter of about 50 nm were dispersed in alcohol was used. This solution was prepared by the following method.

First, a silicon plate was disintegrated mechanically to obtain silicon particles. Then, 10 g of the silicon particles (first substance) was put into 10 mL of 1-propyl alcohol (aqueous solvent) and an ultrasonic wave was applied thereto. Thus, a dispersion liquid in which silicon particles were dispersed in 1-propyl alcohol was obtained.

Next, 2 mL of the dispersion liquid was added to 10 mL of pure water, and an ultrasonic wave was applied thereto. Thus, a solution (hereinafter referred to as a solution (A) in Examples) containing silicon particles and 1-propyl alcohol was prepared.

As an organic solvent, n-hexadecane was used to disperse the second substance therein. Since it is intended to verify the principle of the method of the present invention in the present reference example, a substance equivalent to the second substance was not dispersed in n-hexadecane.

(2) Preparation of Substrate

A substrate was fabricated using the method described with reference to FIG. 3A to FIG. 3E in the first embodiment. The method of fabricating a substrate in the present reference example is described below with reference to FIG. 3A to FIG. 3E.

First, a silicon wafer of 4 inches in diameter was irradiated with ultraviolet light in ozone to remove organic substances on the surface of the wafer and oxidize the surface thereof. The silicon wafer after the treatment was a silicon substrate having a surface coated with an oxide film. The static contact angle of the surface of this silicon substrate with respect to pure water was 10 degrees or less.

Subsequently, a nickel film with a thickness of 10 nm was formed on the surface of the silicon substrate and a gold film with a thickness of 100 nm was formed on the nickel film by an electron beam evaporation method.

Then, a pattern of a positive resist film was formed by the photolithography method. The pattern of the resist film was a rectangle with sides of 2 μm to 2 mm in length, or a circle with a diameter of 2 μm to 2 mm.

Next, the silicon substrate was dipped in an etchant for gold and an etchant for nickel in this order to remove the metal film in the region that had not been coated with the resist film.

Then, the silicon substrate was exposed to an oxygen plasma atmosphere in vacuum to remove the resist film.

As a result, a metal film pattern was formed on the silicon substrate.

Next, a pattern of a positive resist film was formed, by the photolithography method, on the region of the silicon substrate that had not been coated with the metal film. The pattern having the same shape as the pattern of the metal film was formed.

As a result of these steps, a pattern of a metal film 302, a pattern of a positive resist film 303, and a region 304 where the surface of the substrate 301 was exposed were formed on the surface of the substrate 301, as shown in FIG. 3A.

Next, the substrate 301 was dipped for 2 hours in perfluorooctane in which 1 vol % FAS was dissolved, and then washed by oscillation in perfluorooctane. This procedure was performed in a dry nitrogen gas atmosphere.

As a result of this procedure, a monomolecular film 305 of FAS was formed in the region 304 where the surface of the substrate was exposed. FIG. 3B illustrates the monomolecular film 305 as if it also is formed on the surfaces of the metal film 302 and the resist film 303. It is not known, however, whether or not the film was formed actually on these surfaces.

Since FAS has a fluorocarbon group, the region (corresponding to the region 304 in FIG. 3A) where the monomolecular film 305 of FAS was formed served as the third region coated with fluorocarbon groups.

Next, the substrate 301 was washed by oscillation in acetone to remove the resist film 303. As a result of this procedure, a region 306 where the surface of the substrate 301 was exposed was formed in the region where the resist film 303 had been provided, as shown in FIG. 3C.

Next, the substrate 301 was dipped for 3 hours in a mixed solution of n-hexadecane and chloroform (at a volume ratio of 4:1) in which 1 vol % octadecyltrichlorosilane ($CH_3(CH_2)_{17}SiCl_3$; hereinafter referred to as "OTS") was dissolved, and then washed by oscillation in chloroform. This procedure was performed in a dry nitrogen gas atmosphere.

As a result of this procedure, a monomolecular film 307 of OTS was formed in the region 306 where the surface of the substrate was exposed, as shown in FIG. 3D. The region where the monomolecular film 307 of OTS was formed served as the second region coated with hydrocarbon groups.

Next, the substrate 301 was dipped in an etchant for gold and an etchant for nickel in this order to remove the metal film 302. As a result of this procedure, a region 308 where the surface of the substrate was exposed was formed, as shown in FIG. 3E.

Since the surface of the substrate 301 was hydrophilic, the region 308 served as the hydrophilic first region.

As a result of this series of procedures, the substrate having the first to third regions on its surface was fabricated.

Figure 6A:
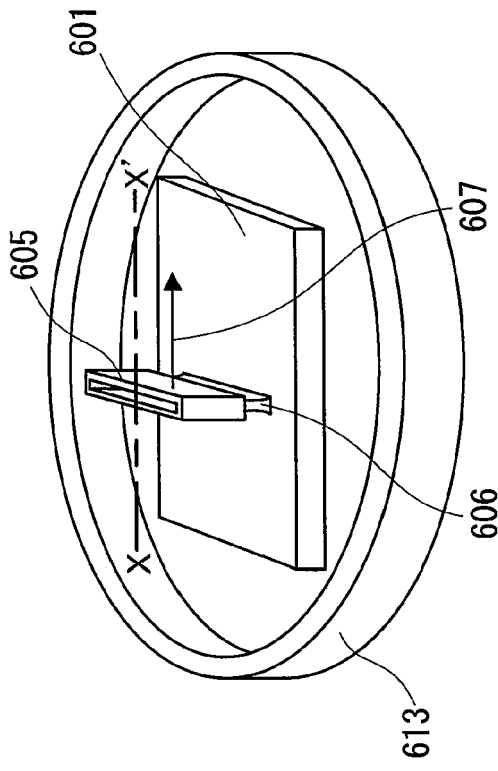
FIG. 6A to FIG. 6C are schematic diagrams showing how two types of substances are disposed on a substrate in Reference Example of the method of disposing two types of substances on a substrate according to the present invention.

(3) Method of Applying Solution (Solution (A)) Containing Silicon Particles and 1-propyl Alcohol FIG. 6A shows the outline of the method of applying the solution (A). A glass plate 602 measuring 30 mm in width, 20 mm in height and 1 mm in thickness was placed perpendicularly to a substrate 601 with a spacing of 0.2 mm therebetween. The substrate 601 is a substrate having the first to third regions on its surface fabricated by the above-mentioned method.

Though not shown in FIG. 6A, the glass plate 602 is fixed with a fixing jig. The fixing jig was coupled to a mechanism for adjusting the spacing between the glass plate 602 and the substrate 601 and moving the glass plate 602 in the direction of an arrow 604 with respect to the substrate 601 while maintaining the predetermined spacing between the glass plate 602 and the substrate 601.

The solution (A) was introduced between the glass plate 602 and the substrate 601 with a pipette so as to form a curtain-like liquid film 603 therebetween. Subsequently, the solution (A) was applied to the substrate 601 by moving the glass plate 602 in the direction of the arrow 604 at a rate of 10 mm/s. Then, the substrate 601 was allowed to dry naturally for 30 minutes at room temperature.

(4) Method of Applying n-hexadecane

Figure 6B:
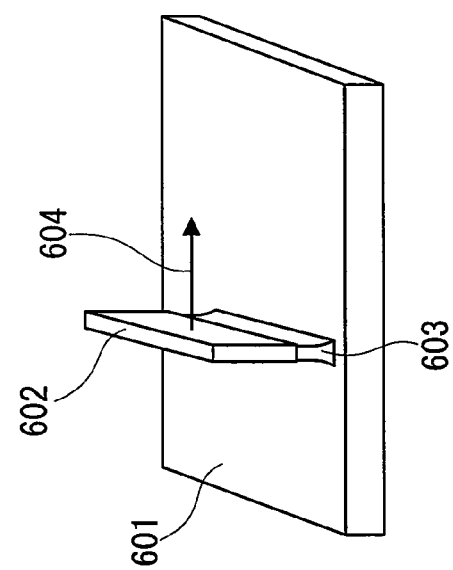
Figure 6C:
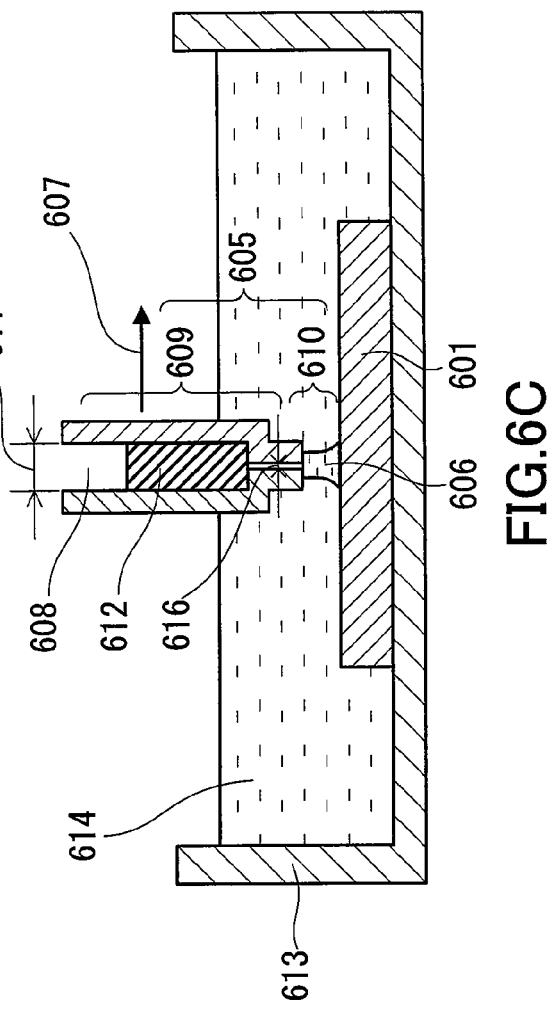

FIG. 6B and FIG. 6C are schematic diagrams showing how n-hexadecane is applied to the surface of the substrate 601 in 2,2,2-trifluoroethanol 614. In FIG. 6B, the 2,2,2-trifluoroethanol 614 is not shown. The method of applying n-hexadecane in the present example is shown with reference to FIG. 6B and FIG. 6C.

First, the substrate 601 was placed on the bottom of a petri dish 613 with a diameter of 12 cm and a depth of 2.5 cm, and a slit coater 605 was placed above the upper surface of the substrate 601. The structure of a slit 608 and the positional relationship between the slit 608 and the substrate 601 are described below with reference to FIG. 6B and FIG. 6C. Since n-hexadecane had not yet been introduced into the slit 608 at this time, the liquid film 606 in FIG. 6B and FIG. 6C was not present actually. The 2,2,2-trifluoroethanol 614 also was not present there.

The slit coater 605 had a structure in which the slit 608 was formed penetrating inside a stainless steel plate measuring 30 mm in width, 30 mm in height and 5 mm in maximum thickness. The width 611 of the slit was 3 mm in the upper portion 609 of the slit coater, and the width 616 of the slit was 0.5 mm in the lower portion 610 of the slit coater. Absorbent cotton was placed inside the slit 608.

As shown in FIG. 6C, the spacing between the substrate 601 and the tip of the lower portion 610 of the slit coater was set to 0.2 mm. Though not shown in FIG. 6B and FIG. 6C, the slit coater 605 was fixed with a fixing jig. The fixing jig was coupled to a driving member (not shown) for adjusting the spacing between the surface of the substrate 601 and the slit coater 605 and moving the slit coater 605 in the direction of an arrow 607 with respect to the substrate 601 while maintaining the predetermined spacing between the substrate 601 and the slit coater 605.

Next, the 2,2,2-trifluoroethanol 614 was poured into the petri dish 613 slowly so that a part of the upper portion 609 of the slit coater was immersed in the liquid. Next, n-hexadecane was introduced slowly from the upper side of the slit 608 so as to form the curtain-like liquid film 606 between the lower portion 610 of the slit coater and the substrate 601. Subsequently, n-hexadecane was applied to the surface of the substrate 601 by moving the slit coater 605 at a rate of 10 mm/s in the direction of the arrow 607.

Then, the substrate 601 was pulled out of the 2,2,2-trifluoroethanol 614.

As a method of a comparative example to the present reference example, the solution (A) was applied to a substrate having the same structure as the substrate 601 and dried at room temperature, and then n-hexadecane was applied thereto in air.

(5) Results of Application

Figure 7A:
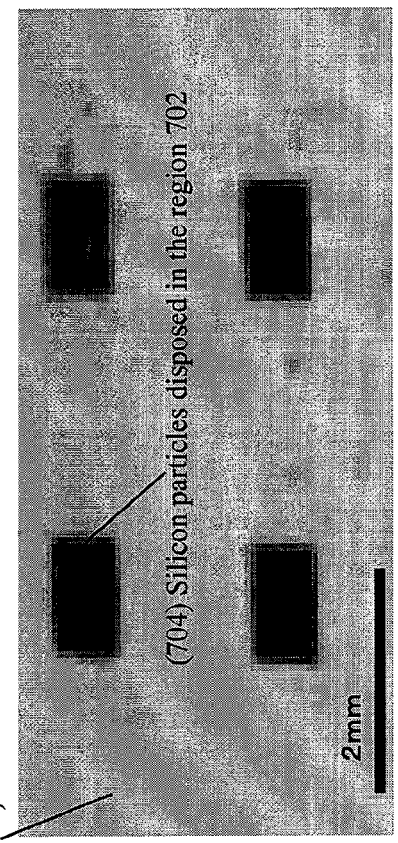
FIG. 7A is a schematic plan view of a substrate to which a solution has not yet been applied.
Figure 7B:
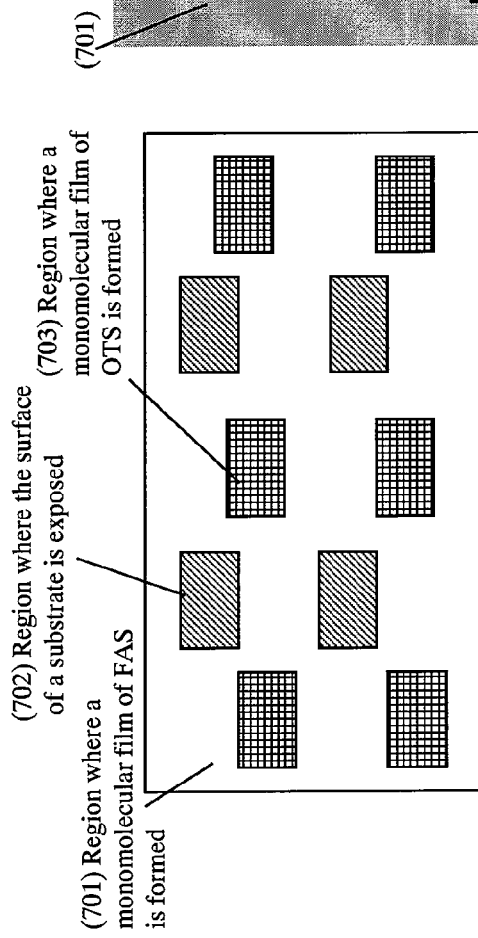
FIG. 7B is a micrograph of the surface of the substrate to which a solution containing silicon particles and an aqueous solvent has been applied and dried.
Figure 7C:
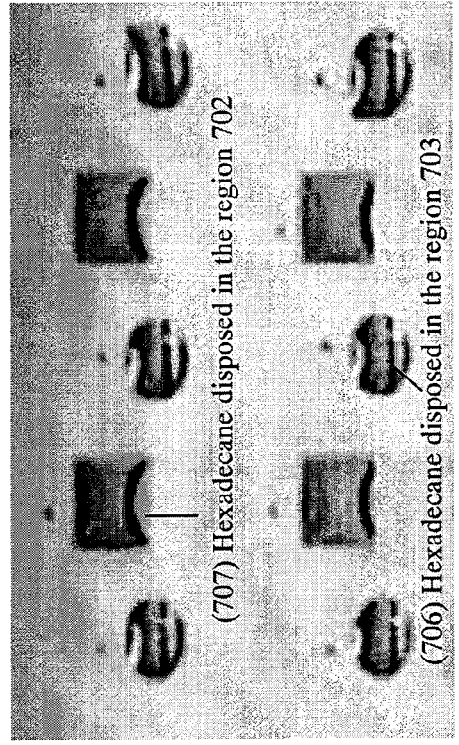
FIG. 7C is a micrograph of the surface of the substrate to which a solution containing silicon particles and 1-propyl alcohol has been applied and dried and then n-hexadecane has been applied in 2,2,2-trifluoroethanol, (i.e., a micrograph of the surface of the substrate that has been dipped in 2,2,2-trifluoroethanol)
Figure 7D:
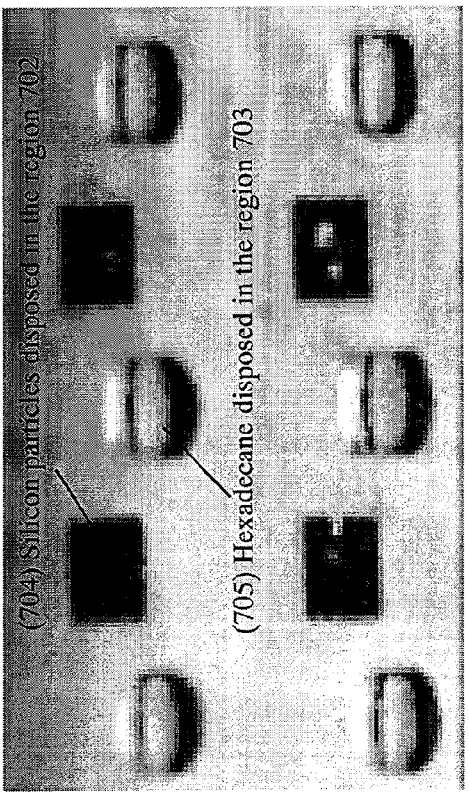
FIG. 7D is a micrograph of the surface of the substrate to which the solution containing silicon particles and 1-propyl alcohol has been applied and dried and then n-hexadecane has been applied in air.

FIG. 7A is a schematic plan view of the substrate used in the present reference example and the above-mentioned comparative example. FIG. 7B to FIG. 7D are each a micrograph of the surface of the substrate to which the solution (A) has been applied in the present reference example and the above-mentioned comparative example. In FIG. 7B to FIG. 7D, the position of each region on the surface of the substrate corresponds to the position of each region on the surface of the substrate shown in the schematic plan view of FIG. 7A.

In the schematic plan view of FIG. 7A, a region 702 where the surface of the substrate is exposed, a region 703 where a monomolecular film of OTS is formed, and a region 701 where a monomolecular film of FAS is formed correspond to the first region, the second region, and the third region, respectively.

FIG. 7B is a micrograph of the surface of the substrate to which the solution (A) has been applied in air and dried at room temperature in the present reference example.

This micrograph shows that silicon particles 704 are disposed selectively in the region 702 where the surface of the substrate is exposed.

FIG. 7C is a micrograph of the surface of the substrate to which n-hexadecane has been applied in 2,2,2-trifluoroethanol in the present reference example.

This is a micrograph of the substrate that has been dipped in 2,2,2-trifluoroethanol.

This micrograph shows that n-hexadecane 705 is disposed selectively only in the region 703 where the monomolecular film of OTS is formed.

From these results, it was confirmed that the silicon particles and n-hexadecane had been disposed selectively in the first region and the second region, respectively.

When this substrate was pulled out into air, the disposition of the silicon particles and hexadecane was maintained.

Figure 8:
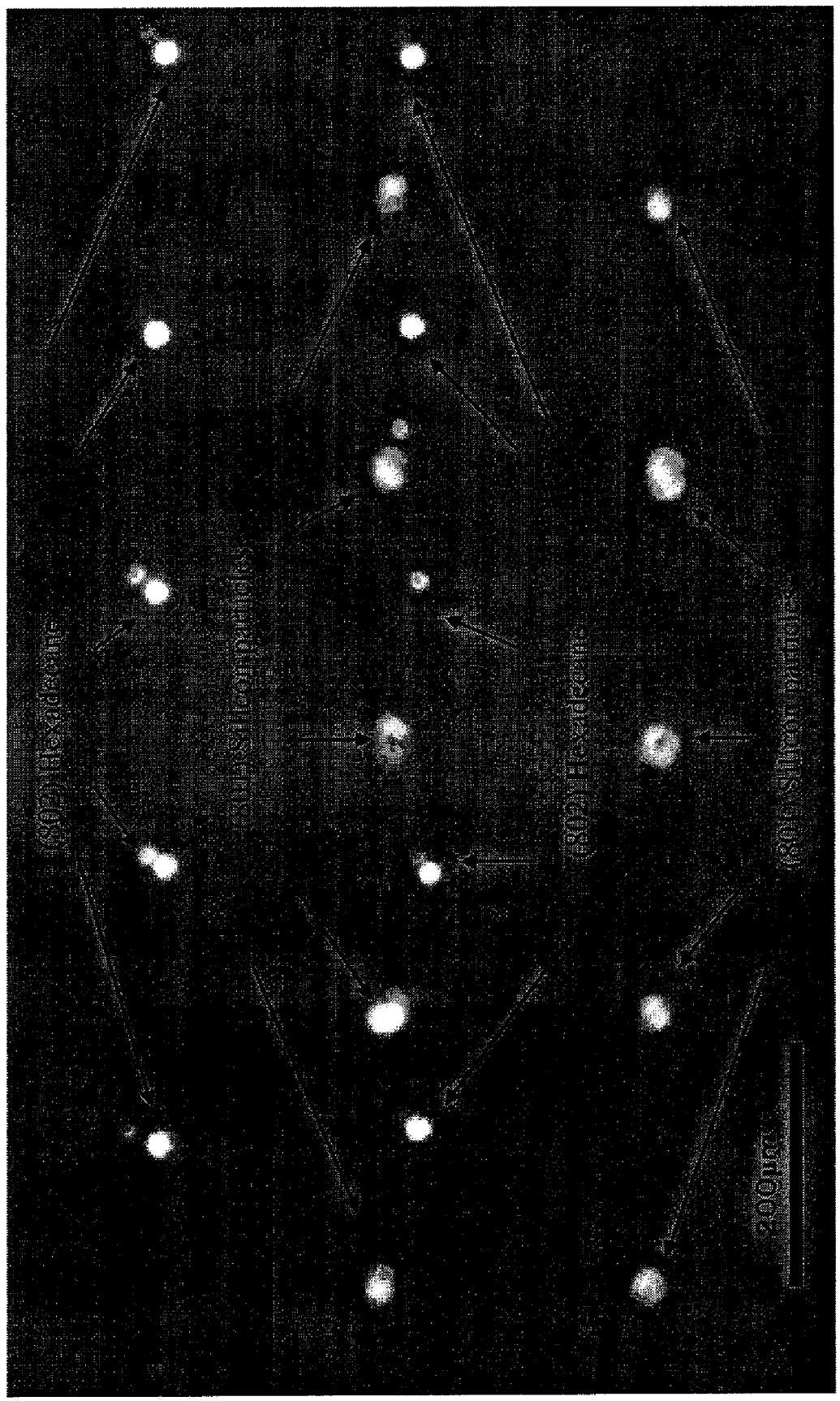
FIG. 8 is a micrograph of the surface of the substrate to which a solution in which silicon particles are dispersed in 1-propyl alcohol has been applied and dried and then n-hexadecane has been applied in 2,2,2-trifluoroethanol, and which then has been pulled out of 2,2,2-trifluoroethanol.
Figure 10B:
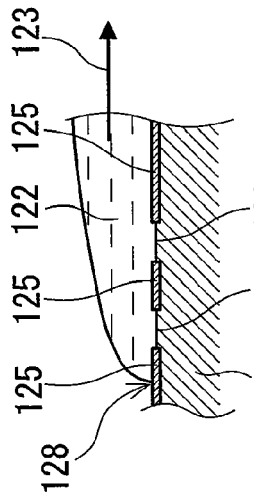
FIG. 10A to FIG. 10E are schematic cross-sectional views showing the principle of the dewetting method.
Figure 10C:
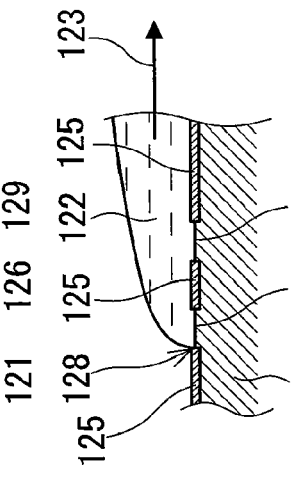
Figure 10D:
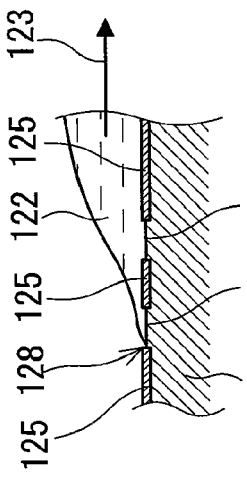
Figure 10E:
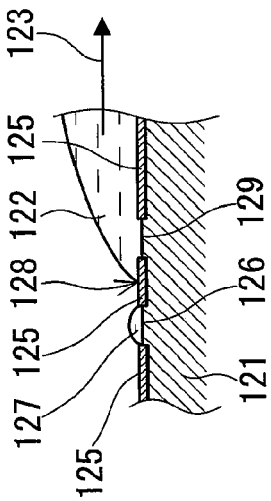
Figure 10A:
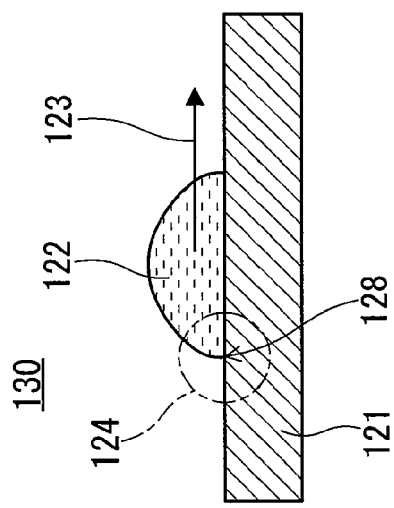

FIG. 8 is a micrograph of the surface of the substrate on which the circular first region with a diameter of 100 μm and the second region made of a monomolecular film of OTS are formed, among the substrates pulled out of 2,2,2-trifluoroethanol into air in the present reference example.

In this micrograph, the positions of silicon particles 801 and n-hexadecane 802 are shown respectively by arrows. It was confirmed that the positions of the silicon particles 801 and n-hexadecane 802 corresponded to the hydrophilic first region and the second region where a monomolecular film of OTS was formed, respectively.

Accordingly, it was proved that in the present reference example, the silicon particles and n-hexadecane had been disposed selectively in the first region and the second region, respectively.

FIG. 7D is a micrograph of the surface of the substrate to which the solution (A) has been applied and dried in air, and then n-hexadecane has been applied in air, as a comparative example.

This micrograph shows that when n-hexadecane is applied in air, n-hexadecane is disposed also in the region (first region) where the silicon particles have already been disposed, and thus n-hexadecane is disposed in both the region (indicated by 707 in FIG. 7D) and the region 706 where a monomolecular film of OTS has been formed.

From this result, it was proved that in air, n-hexadecane could not be applied only to the region where the monomolecular film of OTS has been formed. Presumably, the reason why n-hexadecane is disposed also in the region where the silicon particles are present when n-hexadecane is applied in air is because the silicon particles are hydrophilic.

As described above, the basic principle of the present invention was demonstrated by the present reference example.

Example 1

An experiment was carried out in the same manner as in Reference Example, except that a solution in which silicon oxide particles (with an average particle diameter of 300 nm) having surfaces coated with hexyl groups ($—(CH_2)_5—CH_3$) were dispersed in hexane was used in place of n-hexadecane used in Reference Example. More specifically, in Example 1, silicon oxide particles having surfaces coated with hexyl groups ($—(CH_2)_5—CH_3$) were used as a second substance, and hexane was used as an organic solvent.

The method of preparing the solution (hereinafter referred to as a solution (B)) containing silicon oxide particles and hexane is described below.

First, 30 mL of a hexane solution in which 1 vol % hexyltrichlorosilane is dissolved and 0.3 g of silicon oxide (particles (colloidal silica) with an average particle diameter of 300 nm (manufactured by Fuso Chemical Co., Ltd.) were put into a 50 mL centrifuge tube and covered with a lid, and then allowed to stand overnight.

This procedure was performed in a dry nitrogen atmosphere. Subsequently, the centrifuge tube was placed in an ultrasonic wave wash tank to apply an ultrasonic wave thereto. Thereby, silicon oxide particles were dispersed uniformly in hexane.

Subsequently, the centrifuge tube was set in a centrifugal separator and was rotated at 5000 rpm for 10 minutes. Thereby, the silicon oxide particles were settled on the bottom of the centrifuge tube.

In the dry nitrogen atmosphere, the supernatant fluid in the centrifuge tube was sucked out with a pipette, and hexane in an amount equal to the amount of the sucked supernatant fluid was put into the centrifuge tube. Then, an ultrasonic wave was applied to the centrifuge tube to disperse the silicon oxide particles.

Then, the silicon oxide particles were settled using the centrifugal separator, the supernatant fluid was removed, hexane was added, and an ultrasonic wave was applied again according to the method described above. This procedure of centrifugal separation, settlement, and dispersion was repeated five times. As a result, a whitish transparent hexane solution was obtained. A drop of this hexane solution was sucked with a syringe and dropped on a glass substrate, and then hexane was removed by drying. The resulting surface of the substrate was observed with an optical microscope. As a result, monodispersed silicon oxide particles were observed on the surface of the substrate. This result showed that silicon oxide particles having surfaces coated with hexyl groups had been dispersed uniformly in hexane. Thus, the solution (B) was obtained by this method.

Meanwhile, a mixed solution of 0.3 g of silicon oxide particles that had not been treated with hexyltrichlorosilane and 30 mL of hexane was put into a glass container, and an ultrasonic wave was applied thereto. After the application of the ultrasonic wave, the supernatant fluid of the hexane solution was transparent, and the silicon oxide particles were present in an agglomerated state on the bottom of the container. A drop of the supernatant fluid of this hexane solution was drawn with a syringe and dropped on the glass substrate, and then hexane was removed by drying. The resulting surface of the substrate was observed with an optical microscope. As a result, however, no silicon oxide particles were observed on the surface of the substrate. This result showed that silicon oxide particles were not present in the supernatant fluid of the hexane solution and had not been dispersed in the solution. Accordingly, presumably, the reason why silicon oxide particles treated with hexyltrichlorosilane are dispersed in hexane is because the surfaces of these particles are coated with hexyl groups.

The solution (A) and the solution (B) were applied to the substrate in this order by the method described in Reference Example.

Specifically, the solution (A) was applied to the substrate by the method described in Reference Example, and then allowed to dry naturally for 30 minutes at room temperature. Subsequently, the solution (B) was applied to the substrate that had been dipped in 2,2,2-trifluoroethanol by the method in which n-hexadecane was applied in Reference Example. Then, the substrate was pulled out of 2,2,2-trifluoroethanol, and allowed to dry naturally for 10 minutes in a room temperature atmosphere.

As a result, as in the case of Reference Example, the silicon particles were disposed in the first region of the substrate, and the silicon oxide particles having surfaces coated with hexyl groups were disposed in the second region.

Example 2

The solution (A) and the solution (B) were applied by the method described in Example 1. The solution (A) and the solution (B) were applied in the reverse order to that in Example 1.

First, the solution (B) was applied to the substrate in 2,2,2-trifluoroethanol. The substrate was pulled out of the 2,2,2-trifluoroethanol, and allowed to dry naturally for 10 minutes at about room temperature.

Subsequently, the solution (A) was applied to the substrate in air, and then allowed to dry naturally for 30 minutes at room temperature.

As a result, the silicon particles and the silicon oxide particles were disposed selectively in the hydrophilic region and the OTS region, respectively.

INDUSTRIAL APPLICABILITY

In the method of the present invention using the photolithography method, the size of the regions where the first substance and the second substance are to be disposed can be reduced to the micrometer scale. Therefore, the method of the present invention makes it easier to dispose two types of substances selectively in micrometer-sized regions. Further, the method of the present invention makes it possible to apply a solution containing the first substance or a solution containing the second substance to a large-area substrate with an inexpensive applicator such as a slit coater. Therefore, the method of the present invention can be used to form two types of micro-patterns on a large-area substrate at low cost. Since these effects can be obtained by the method of the present invention, this method is applicable as a method of disposing selectively n-type and p-type silicon particles with a diameter of nanometer size. Therefore, a transistor having a PN junction can be formed on a large-area substrate at low cost. Further, the method of the present invention also is applicable as a method of disposing selectively an electrode material and a semiconductor material. Therefore, an electrode and an active layer as elements of a transistor can be formed on a large-area substrate at low cost.

Because of the advantages described above, the method of the present invention is applicable, for example, to a fabrication method of a large-area organic electroluminescence display. Therefore, an electrode and an active layer of a transistor for driving such a large-area organic electroluminescence display can be fabricated with high accuracy at low cost.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of disposing selectively on a surface of a substrate a first substance having a hydrophilic surface and a second substance having a surface coated with a hydrocarbon group,
   wherein the substrate has on the surface thereof a first region, a second region, and a third region, the first region being hydrophilic, the second region being coated with a hydrocarbon group, and the third region being coated with a fluorocarbon group, and
   wherein the method comprises the steps of
   (1) applying a solution containing the first substance and an aqueous solvent to the substrate;
   (2) removing the aqueous solvent from the surface of the substrate so as to dispose the first substance on a surface of the first region;
   (3) dipping the substrate in a liquid containing alcohol having fluorine in its molecule;
   (4) applying a solution containing the second substance and an organic solvent to the surface of the substrate that has been dipped in the liquid;
   (5) pulling the substrate out of the liquid; and
   (6) removing the organic solvent from the surface of the substrate so as to dispose the second substance on a surface of the second region.

2. The method according to claim 1, wherein the liquid is 2,2,2-trifluoroethanol.

3. A method of disposing selectively on a surface of a substrate a first substance having a hydrophilic surface and a second substance having a surface coated with a hydrocarbon group,
   wherein the substrate has on the surface thereof a first region, a second region, and a third region, the first region being hydrophilic, the second region being coated with a hydrocarbon group, and the third region being coated with a fluorocarbon group, and
   wherein the method comprises the steps of
   (1) dipping the substrate in a liquid containing alcohol having fluorine in its molecule;
   (2) applying a solution containing the second substance and an organic solvent to the surface of the substrate that has been dipped in the liquid;
   (3) pulling the substrate out of the liquid;
   (4) removing the organic solvent from the surface of the substrate so as to dispose the second substance on a surface of the second region;
   (5) applying a solution containing the first substance and an aqueous solvent to the substrate; and
   (6) removing the aqueous solvent from the surface of the substrate so as to dispose the first substance on a surface of the first region.

4. The method according to claim 3, wherein the liquid is 2,2,2-trifluoroethanol.

* * * * *